(12) United States Patent
Augusto

(10) Patent No.: US 7,153,720 B2
(45) Date of Patent: Dec. 26, 2006

(54) CMOS IMAGE SENSOR

(75) Inventor: Carlos J. R. P. Augusto, San Jose, CA (US)

(73) Assignee: Quantum Semiconductor LLC, San Jose, CA (US)

( * ) Notice: Subject to any disclaimer, the term of this patent is extended or adjusted under 35 U.S.C. 154(b) by 0 days.

(21) Appl. No.: 11/142,783

(22) Filed: Jun. 1, 2005

(65) Prior Publication Data

US 2005/0233493 A1    Oct. 20, 2005

Related U.S. Application Data

(63) Continuation of application No. PCT/EP03/13953, filed on Dec. 9, 2003.

(60) Provisional application No. 60/431,488, filed on Dec. 9, 2002.

(51) Int. Cl.
*H01L 21/00*    (2006.01)

(52) U.S. Cl. ...................................................... 438/69

(58) Field of Classification Search .................. 438/69, 438/75
See application file for complete search history.

(56) References Cited

U.S. PATENT DOCUMENTS

| | | | | |
|---|---|---|---|---|
| 5,227,313 A | * | 7/1993 | Gluck et al. | ................... 438/66 |
| 5,234,860 A | * | 8/1993 | Gluck | .......................... 438/67 |
| 5,904,495 A | * | 5/1999 | Burke et al. | ................... 438/98 |
| 6,168,965 B1 | | 1/2001 | Malinovich et al. | |
| 6,498,073 B1 | * | 12/2002 | Sarma et al. | ................ 438/459 |
| 2003/0025160 A1 | * | 2/2003 | Suzuki et al. | ................ 257/347 |

FOREIGN PATENT DOCUMENTS

WO    WO 02058153    7/2002

OTHER PUBLICATIONS

Astilean S. et al—"Light Transmission through Metallic Channels Much Smaller Than the Wavelength" COPY—9 pages (1999).
Martin O.J.F. "Surface Plasmon Illumination Scheme for Contact Lithography Beyond the Diffraction Limit"—COPY—7 pages (2003).

* cited by examiner

*Primary Examiner*—Lex H. Malsawma
(74) *Attorney, Agent, or Firm*—Sturm & Fix LLP

(57) ABSTRACT

Light sensing devices are monolithically integrates with CMOS devices on Thin-Film Silicon-On-insulator (TF-SOI) or Thin-Film Germanium-On-Insulator (TF-GeOI) substrates. Photo-diode active layers are epitaxially grown on the front-side of the substrate and after full processing of the front-side of the substrate, the substrate material is removed under the buried insulator (buried oxide). Monolithically integrated structures are then fabricated on the back of the buried oxide. The back-side is then bonded to a new substrate that is transparent to the wavelengths of interest. For example, quartz, sapphire, glass, or plastic, are suitable for the visible range. Back-side illumination of the sensor matrix is thereby allowed, with light traveling through the structures fabricated on the back of the substrate, opposite to the side on which CMOS is made.

20 Claims, 26 Drawing Sheets

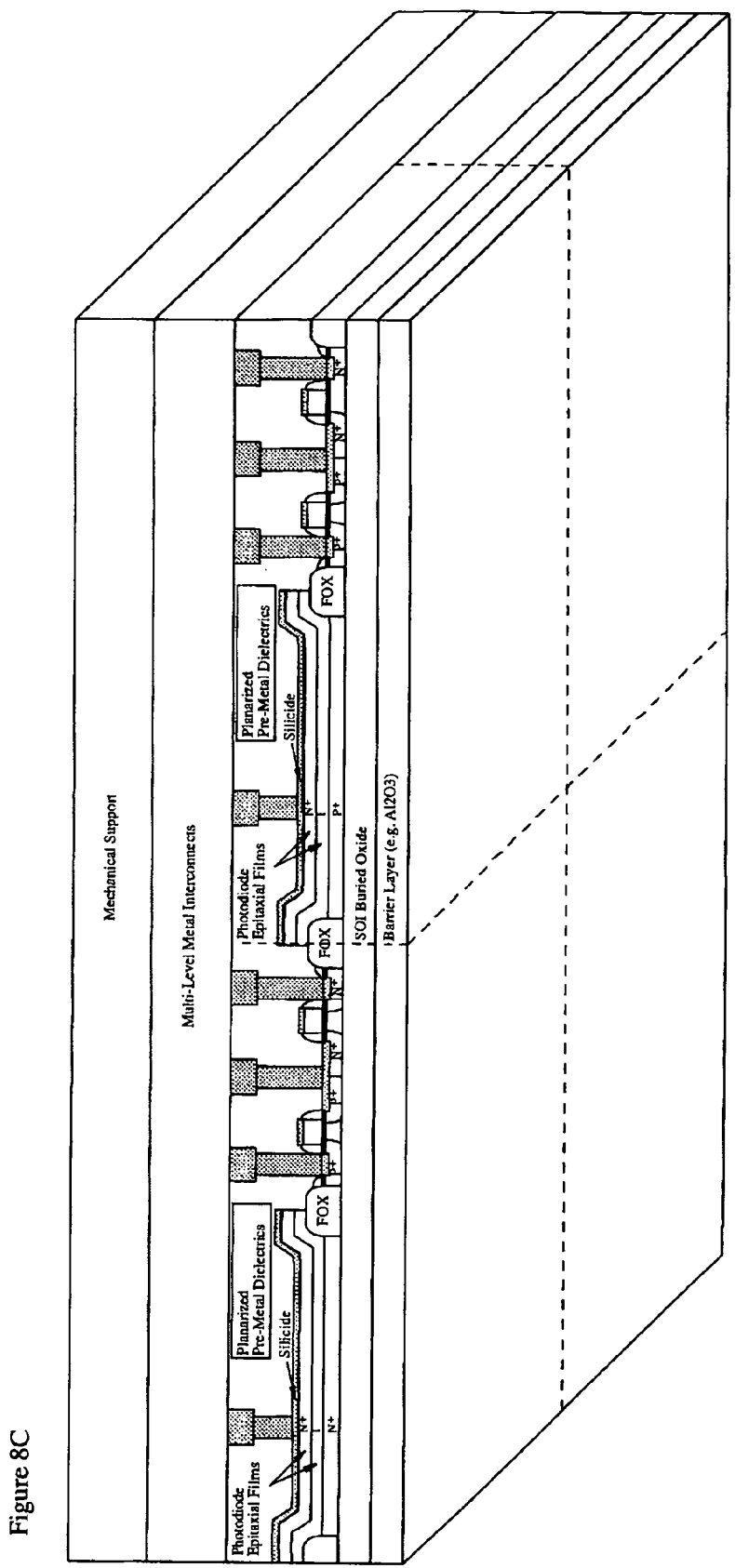

CMOS IMAGE SENSOR

CROSS REFERENCE TO RELATED APPLICATIONS

This application is a Continuation application of PCT/EP2003/013953 filed Dec. 9, 2003, claiming priority of U.S. Patent Application No. 60/431,488 filed Dec. 9, 2002, which are included in their entirety by reference made hereto.

BACKGROUND OF THE INVENTION

The present invention relates to methods of optical to electronic conversion, in particular to photo-detection with silicon-based devices suitable for integration with Complementary Metal Oxide Semiconductor (CMOS) technology.

Conventional Charge Coupled Devices (CCDs) and CMOS image sensors (CIS) comprise several elements that are key to high performance image sensing. The photo-diode, which converts light into electrical signals, the CMOS devices and circuits that handle the analog signal, convert it to a digital signal, and that perform digital signal processing, the color filters, etc. CIS technology has the advantage that all these elements can be monolithically integrated on the same "die" or "chip", while CCDs can only monolithically integrate color filtering and photo-absorption.

In conventional CIS technology the built-in vertical pn-junctions, source-to-well and drain-to-well junctions, formed during the fabrication of the CMOS devices, are used as photo-diodes for light detection. The photo-detection capabilities depend on the intrinsic energy band-structure properties of silicon, such as the coefficient of absorption, and on several characteristics of the junctions, such as doping profiles, junction depth, depth of isolation structures (LOCOS or STI), etc.

The efficiency of light absorption by silicon is highly dependent on the wavelength. Photons of shorter wavelengths (photons with higher energy) are absorbed within shorter distances from the surface, than photons of longer wavelengths (photons with smaller energy). For silicon, in the visible range, photons of the color blue are absorbed very efficiently, but photons of the color red are not, and thus require a much longer "absorption depth". Therefore, the absorption of photons of the color red places a limit on the minimum thickness of the light-absorbing region.

On the other hand, advancing CMOS technology consists in shrinking the lateral dimensions of transistors, which require also the shrinking of structures in the vertical direction, i.e., shallower, higher doped junctions. Essentially smaller MOSFETs require source and drain regions that are nearly or fully degenerately doped. Consequently, inside these semiconductor regions an electric field is very weak or completely shielded, thus leading to charge transport only through diffusion. Since for CIS devices light is absorbed in the source/drain region of a MOSFET, the absorption of very short wavelengths (shorter than Blue) takes place very near the surface, thus the electron-hole pairs have very short lifetimes, i.e., high recombination rates. Therefore the amount of charge collected is only a fraction of the total that is photo-generated. This explains the lower quantum efficiency of CIS devices for wavelengths that silicon absorbs very efficiently, such as UV radiation.

The requirements for efficient photo-absorption of the longer wavelengths, and for efficient collection of charge carriers photo-generated by shorter wavelengths, are in a collision course with the requirements for the continued scaling of CMOS technology, even on bulk substrates.

It is widely perceived that Thin-Film SOI substrates are highly beneficial, perhaps even a required to fabricate high performance sub-90 nm CMOS devices. The more advanced the CMOS technology, the greater the advantages of using Thin-Film SOI substrates. However, conventional CCDs and CIS devices utilize the bulk of the silicon wafer for photo-absorption, while with Thin-Film SOI the top silicon film, which is used to make CMOS devices, cannot efficiently absorb wavelengths in the visible, because it is too thin, i.e., the optical path inside the absorption film is too short.

Therefore, it can be said that conventional CIS technology is fundamentally incompatible with Thin-Film SOI substrates, and consequently incompatible with the requirements for high performance sub-90 nm CMOS technologies. It can then be concluded that conventional CMOS image sensors will not be able to take advantage of the well known benefits of CMOS scaling, also known as "Moore's Law", in terms of speed, density, power dissipation and cost.

More advanced CMOS devices are important both inside the pixels and at the periphery of the sensor matrix. Active-pixel sensors require in-pixel transistors, which take area that does not contribute to photo-absorption. The ratio of the sensor-area over the total area of the pixel is called the "Fill Factor". The inability to scale the size of CMOS devices will ultimately result in the impossibility to scale the size of pixels of CIS. Consequently this will also put a limitation on how small the entire image sensor can be for a given resolution, which in turn places constraints on the design of the optical system (lenses), thereby impacting the overall system size, weight, cost, etc.

The scaling of the pixel size of CMOS image sensors is also limited by the resolution of the lens system. The quality of the image captured by a CCD or CMOS image sensor matrix, degrades if the pixel size becomes smaller than the minimum feature possible to resolve by the lens system. It is therefore pointless to scale the pixel size below what the lens system can resolve. On the other hand the cost of a lens system increases for higher resolution lenses.

The principles of optical physics used for the design of conventional lens systems are "diffraction limited". This means that it is not possible to design a lens system having a resolution approaching the wavelength of the light that it is meant to focus, even with the non-realistic assumption that the lenses could be manufactured with infinite precision.

Conventional CIS architectures consist of having the source/drain-to-well (vertical) pn-junction of a MOSFET to be also a photo-diode. Such architecture cannot be implemented in Thin-Film Silicon-On-Insulator (TF-SOI) substrates, also known as Fully-Depleted SOI (FD-SOI), in which such (vertical) pn-junction does not exist, since the source and drain regions of MOSFETs are formed directly on the buried oxide, rather than on a semiconductor region doped with impurities of opposite polarity. However, even if such junctions did exist on Thin-Film SOI CMOS devices, since the crystalline silicon film is so thin, typically less than 30 nm, the absorption of light in the visible range would be very inefficient, and insufficient to be of practical use for image sensors.

The present invention discloses a solution to enable the fabrication of high performance CMOS image sensors using Thin-Film SOI substrates. In addition to the advantages derived from more advanced CMOS devices, such as speed, power consumption, and reduced size, SOI substrates have a qualitative difference with respect to bulk substrates: it is easy to remove the back-side of the SOI substrate, and replace it with a different substrate which is transparent to light. Even though this is possible with both Thick-Film SOI and Thin-Film SOI, there are more advantages to using Thin-Film SOI substrates, as it will be described below.

In conventional CCDs and CIS, color filtering is implemented by fabricating a checkerboard pattern, known as the "Bayer Pattern", in which filters for different colors, typically Red, Green and Blue, alternate across adjacent pixels. The complementary primary colors, Cyan, Yellow and Magenta can also be used. The color filters do not need to be restricted or limited to the usual three primary color pixels. Since conventional Color CMOS Image Sensors are made on bulk silicon wafers, only front-side illumination is possible.

The materials used to fabricate the color filters are not compatible with silicon processing, and conventional color CIS have the color filters made on top of a passivation layer, deposited over the last metallization level. As the number of metal levels increases, so does the distance between the surface of the silicon wafer, where light is absorbed, and the color filters. More metal levels lead to increased color crosstalk between adjacent pixels because more photons impinging at angles far from the normal to the substrate travel through color filters and are absorbed in photo-diodes that do not belong to the same pixels. This is a very important factor, which in practice has limited the number of metal layers 3 or 4, while the leading edge CMOS technologies can have 6 or 7 metal layers. The limitation on the number of metal levels places severe consequences on the "system architecture" that can be fabricated on the same die, thus monolithically integrated, with the image sensors. Advanced digital signal processing, needed for image compression for example, requires the availability of microprocessor and/or digital signal processor cores, which typically demand more metal levels than just 3 or 4.

"Front-side" illumination also requires the light sensing regions not to be blocked by metal lines, thereby placing severe restrictions on the metal lines connecting the in-pixel circuitry to the peripheral circuitry. This limitation to the metal interconnects between the pixels and the periphery limits the maximum bandwidth available for the pixel-to-periphery communications, which in turn has detrimental consequences for parameters such as maximum frame rate, dynamic range, etc.

Back-side illumination of photo-diodes made on Thin-Film SOI is an architectural feature with the potential for many cascading effects on the overall architecture of image sensors. It becomes possible to monolithically integrate different types of structures on the back of the buried oxide, which is impossible to do with bulk substrates, since they require front-side illumination.

Some of these structures do not require any particular layout or processing features on the front side. Examples are conventional color filters, and nano-optics structures, such as Surface-Plasmon Polariton (SPP) structures. Other structures, such as resonant cavities, may require particular layouts of layer thicknesses on the front-side. It must be emphasized that any of these structures per se, or combined in some fashion, are impossible to implement with bulk substrates. As it will be described later, processing the back-side of the wafer and back-side illumination can be taken advantage of for the implementation of completely new structures that will break through the limitations of conventional optical systems, including the fabrication of monolithically integrated lens system capable of sub-wavelength resolution, thereby motivating and justifying the development of sub-wavelength sized pixels, which in turn demand more advanced CMOS technologies.

Therefore, using TF-SOI or TF-GeOI substrate for CMOS image sensors, enabling back-side illumination, is the basic building block for radically new architectures and technologies that overcome the fundamental limitations of conventional imaging systems, composed of image sensors, wavelength filters, lens group.

SUMMARY OF THE INVENTION

The first object of the present invention is a process architecture to fabricate CMOS image sensors on Thin-Film Silicon-On-Insulator (TF-SOI) or Thin-Film Germanium-On-Insulator (TF-GeOI) substrates.

Photo-diode active layers are epitaxially grown on the front-side of the substrate and dense metal interconnects are fabricated over the sensor matrix, on the front-side of the substrate. After full processing of the front-side of the TF-SOI or TF-GeOI substrate, the substrate material is removed under the buried insulator (buried oxide). Monolithically integrated structures are then fabricated on the back of the buried oxide. The back-side is then bonded to a new substrate that is transparent to the wavelengths of interest. For example, quartz, sapphire, glass, or plastic, are suitable for the visible range. Back-side illumination of the sensor matrix is thereby permitted, with light traveling through the structures fabricated on the back of the substrate, opposite to the side on which CMOS is made.

A second object of the present invention is a process architecture to fabricate back-side illuminated color CMOS image sensors on TF-SOI or TF-GeOI substrates, in which conventional color filters are fabricated on the back-side of the buried oxide.

A third object of the present invention is a process architecture to fabricate back-side illuminated color CMOS image sensors on TF-SOI or TF-GeOI substrates, in which Surface Plasmon Polariton (SPP) structures, hereafter designated as "SPP Light-Funnels", are fabricated on the back of the buried oxide, and are thus monolithically integrated with the sensor matrix. The SPP Light-Funnel elements can provide any or all of the following functionalities for wavelengths in the Visible, UV and IR ranges:

1. Wavelength filtering
2. Polarization filtering
3. Wave guiding and confinement of light beams to sub-wavelength dimensions A fourth object of the present invention is a process architecture to fabricate back-side illuminated color CMOS image sensors on TF-SOI or TF-GeOI substrates, in which a "superlens", which is planar or slab-like and capable of sub-wavelength resolution, is fabricated on the back of the substrate, and thus monolithically integrated with the sensor matrix.

BRIEF DESCRIPTION OF THE DRAWINGS

FIGS. 8A to 8H show an exemplary Process Flow for the First Implementation of the SPP Light-Funnel.

DESCRIPTION OF EMBODIMENTS OF THE INVENTION

Back-Side Illuminated TF-SOI CMOS Image Sensors

Figure 1:
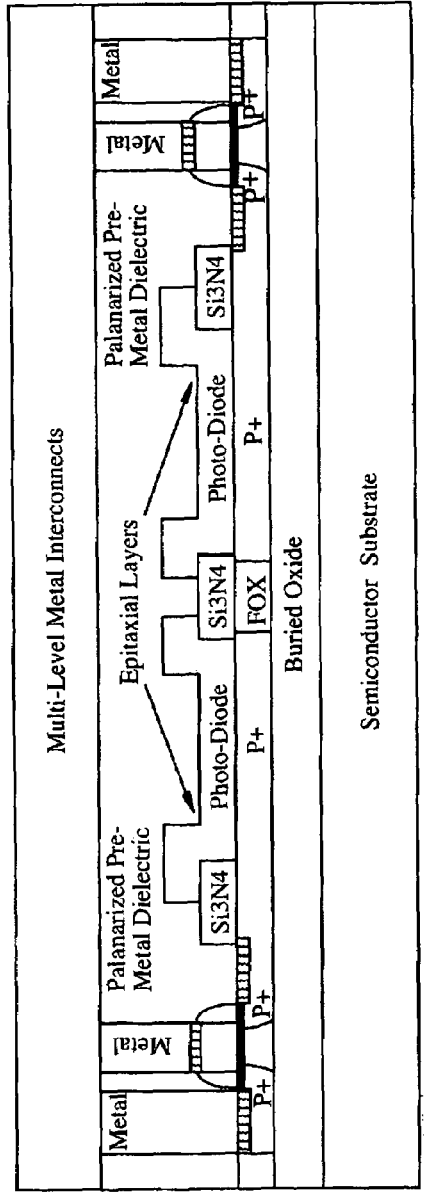
FIG. 1 shows a schematic representation of a fully processed TF-SOI wafer, including the metallization, on which CMOS devices and SAM-APDs are made.

The innovations disclosed in WO 02/033755 and co-pending application PCT/EP/03/10346, which are incorporated herein by way of reference, can be combined to generate a completely new kind of CMOS Imager Sensor (CIS) in which SAM-APDs are made on TF-SOI or TF-GeOI. FIG. 1 shows a schematic representation of a fully processed TF-SOI wafer, in which the CMOS devices, the photo-diode layer, and the complete metallization stack have been made.

In SOI and GeOI substrates, the wafer under the buried oxide is used only as a mechanical support for the buried oxide and top crystalline semiconductor (Si or Ge) films, and it has very little impact on the properties of the CMOS devices to be fabricated on the top crystalline semiconductor film. For this reason the wafer bulk under the buried oxide can easily be replaced by a different mechanical substrate that is transparent to light in wavelengths of interest, such as the UV, Visible, IR, etc.

One particular aspect of SOI substrates that usually is not considered very relevant for the purely electrical CMOS circuits fabricated on SOI, is that the buried oxide in SOI wafers provides an excellent "marker layer" for the process of removal of the thick silicon substrate underneath the buried oxide. From a process technology standpoint, the presence of that "marker layer" makes it very easy to replace the thick silicon substrate by a material that is transparent to IR, Visible and UV light, such as quartz, sapphire, etc. Depending on the application sought, the light-transparent material could also be glass or plastic, which could be much lighter and even flexible It must be emphasized that the replacement by a different mechanical substrate, that is transparent to certain wavelengths, can be done after all the processing has been done on the front-side of the wafer. Therefore there is no need to modify or develop new processing technologies used to fabricate the CMOS devices and photo-diodes on the front-side of the wafer. It should also be kept in kind that removing the substrate under the buried oxide of the TF-SOI (or TF-GeOI) wafer and bonding it to a different substrate can be done at very low temperature, even at room temperature, such that there is no impact on the materials and structures fabricated on the front-side of the TF-SOI (or TF-GeOI) wafer.

The process of removal of the thick wafer under the buried oxide, removes the mechanical support to the buried oxide and top crystalline semiconductor film. For this reason, during the process of removal of the wafer under the buried oxide, the device layers will be temporarily glued to a mechanical holder on the front-side, until bonding the device layers to the final transparent substrate.

With back-side illuminated TF-SOI image sensors, it becomes possible to fabricate structures on the back of the buried oxide, without impacting the processing of the front-side of the wafers, through which the CMOS devices and photo-diodes are fabricated as long as the temperature is kept below the maximum temperature used during the fabrication of interconnects on the front-side.

In standard CMOS processing on bulk wafers, one of the first steps is to make alignment marks that are used by all subsequent patterning steps. The alignment marks are made by etching grooves into the bulk silicon wafer. This procedure can also be applied to SOI wafers, in which case the grooves are etched through the top thin silicon film, the buried oxide, and deep into the silicon substrate underneath the buried oxide.

If the silicon wafer underneath the buried oxide is removed, then the alignment marks disappear. Therefore, extra alignment marks can be made at other levels, for example at the poly level or at the first metal level, that can be used as alignment marks for the patterning steps performed on the back of the buried oxide. This alignment can be as good as the alignment between different patterning steps performed on the front-side of the wafer.

Depending on the thickness of the buried oxide and depending on the structures to be fabricated, it could be preferable to deposit films of light transparent materials directly on the buried oxide prior to fabricating the new structures, which can be of different types or nature.

Figure 2:
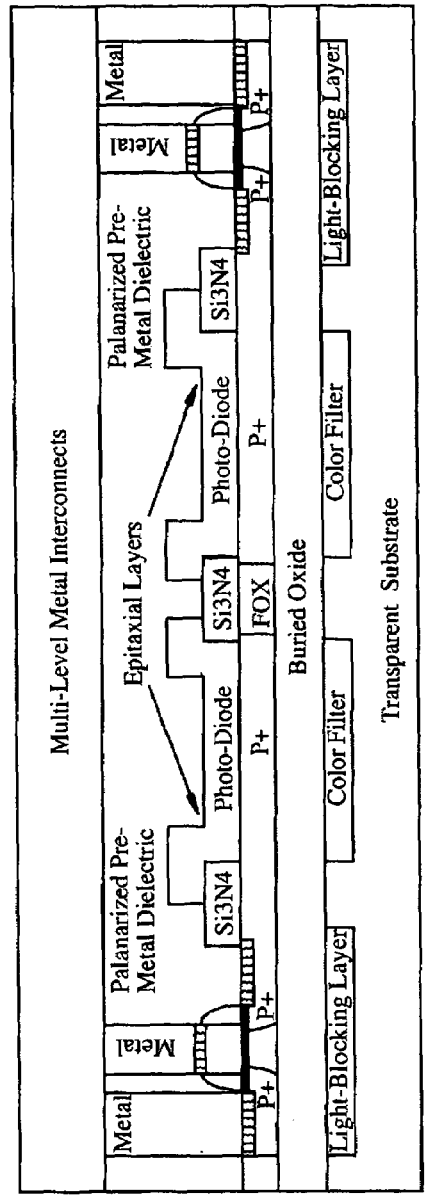
FIG. 2 shows a schematic representation of Thin-Film SOI or Thin-Film GeOI wafers with CMOS devices and SAM-APDs on the front-side, in which the semiconductor substrate underneath the buried oxide has been removed, conventional color filters are made on the buried oxide, and have been bonded to a new and transparent substrate.

After removing the thick wafer under the buried oxide, but before bonding the device layers to the final transparent substrate, it is possible to fabricate additional structures directly on the buried oxide. For example, it is highly desirable to fabricate colour filters very close to the photo-diodes, because it suppresses colour crosstalk, even when the impinging photons have very oblique angles. FIG. 2 schematically shows conventional color filters made on the buried oxide, aligned with the photo-diodes on the front-side of the wafer.

Another extremely important advantage of back-side illumination over front-side illumination is that it enables dense metal interconnects over the front-side of the sensor matrix, thereby enabling a significant improvement of the bandwidth available between the pixels inside the matrix, and the circuitry at the periphery of the sensor matrix.

Yet another advantage of back-side illumination is the possibility to place a mirror, for example a metal film, on top of the photo-diodes, on the front-side of the substrate. That mirror has the potential to double the absorption efficiency, because it reflects light back into the photo-diode layers, thus effectively doubling the optical path inside the absorbing layers.

One more advantage of back-side illumination is the possibility of fabricating capacitors directly on top of the photo-diodes. Such "in-pixel" capacitors are vertically stacked on the photo-diodes and thus do not impose any area penalty. Depending on the lateral dimensions of the photo-diodes and on the critical dimension of the patterning steps, it is possible to pattern the capacitor films on top of the photo-diodes to make a plurality of smaller capacitors, side-by-side, on top of a single photo-diode. The capacitors can be either connected in series or parallel with the photo-diodes.

Figure 3:
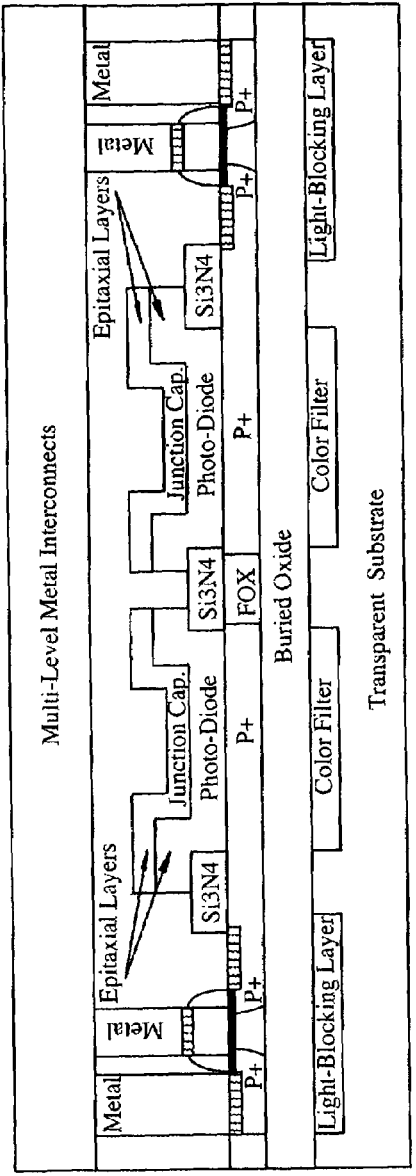
FIG. 3 shows a schematic representation of the in-pixel homo- or hetero-junction capacitor layers, epitaxially grown on the photo-diode layers.
Figure 4:
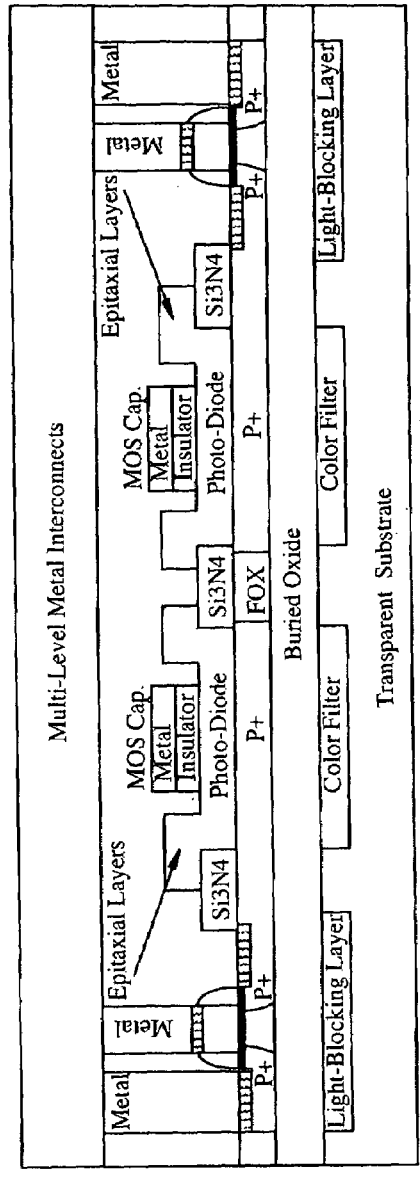
FIG. 4 shows a schematic representation of the in-pixel MOS capacitor made directly on the photo-diode layers.

The in-pixel capacitors can be made with homo- and/or hetero-junctions, epitaxially grown in-situ, immediately after the growth of the epitaxial layers of the photo-diodes. FIG. 3 shows a schematic representation of the in-pixel capacitor layers epitaxially grown on the photo-diode layers.

The in-pixel capacitors can also be made as Metal-Oxide-Semiconductor (MOS) structures. MOS structures can be made by growing or depositing an insulating film directly on the electrode layer of the photo-diodes, followed by the deposition of a metal or degenerately doped semiconductor material. Patterning of the top metal of degenerately doped semiconductor can provide several MOS structures on top of a single photo-diode. The in-pixel capacitors can also be made with Metal-Insulator-Metal (MIM) structures. These structures are made during the metallization phase of the processing. MIM capacitors can be made alternatively or in addition to junction capacitors or MOS capacitors made directly on the photo-diode layers. Depending on the lateral size of the pixels and on the critical dimensions of the MIM fabrication process, it is possible to make a plurality of MIM capacitors over the area of a single pixel.

"Thick-Film" SOI substrates share with "Thin-Film" SOI substrates, the advantages of back-side illumination, wavelength filters made on the buried oxide, and many metal levels with dense interconnects over the pixel areas at the front-side. However, with thicker crystalline silicon films on top of the buried oxide, there is a stronger absorption of the shorter wavelengths in the visible, and UV. Therefore, beyond a certain thickness of the top silicon film, not enough photons of these wavelengths reach the epitaxial layers deposited on that film. For these reasons, it is more advantageous to use Thin-Film SOI to achieve all the advantages in combining the innovations disclosed in WO 02/033755 and in PCT/EP/03/10346, as described in the present disclosure.

A substrate that is transparent allows the photo-diodes to capture light coming also from the back-side of the substrate, rather than just from the front-side. This opens new possibilities for the design of CMOS image sensors:

1. Photo-diodes in 1D or 2D sensor arrays for back-side illumination only.
2. Photo-diodes in 1D or 2D sensor arrays for back-side or front-side illumination.
3. Two sets of photo-diodes in 1D or 2D sensor arrays, one set dedicated to front-side illumination only, while the other set is dedicated to back-side illumination only.

It must be emphasized that these options for combining back-side illumination only, or back-side illumination and/or front-side illumination are not possible for image sensors made on substrates in which the back-side is not transparent to light of the relevant wavelengths.

The architecture for back-side illuminated image sensors is enabled by:

1. Using TF-SOI or TF-GeOI as the initial substrates;
2. Performing the complete processing necessary to fabricate CMOS devices and photo-diodes on the front-side of the wafer, including multi-level metal interconnects;
3. Attaching the front-side of the wafer to a temporary mechanical holder;
4. Removing the semiconductor substrate underneath the buried oxide of the TF-SOI or TF-GeOI wafers.
5. Fabricating additional structures on the back of the buried oxide. All fabrication steps on the back-side are performed at temperatures low enough not to disturb the structures, devices and materials on the front-side of the wafer. All patterning steps on the back-side are aligned to marks made on the front-side of the wafer, for example made with Metal-1 structures, and have the same alignment tolerances as any of the patterning steps performed on the front-side.
6. After complete processing of back-side, performing wafer bonding of the device layers to a light-transparent substrate, and release from the temporary mechanical holder on the front-side.
7. Dicing and packaging.

SPP Light-Funnels

One type of structure suitable to fabricate on the back of the buried oxide of an SOI wafer is a conventional color filter pattern. The fabrication of this structure consists in the deposition and patterning of films that provide color filtering, just as it is now currently done on top of the metallization layers for front-side illumination of bulk silicon wafers.

Another kind of structure is obtained through the deposition and patterning of metal films in order to fabricate Surface Plasmon Polariton (SPP) structures. SPP structures typically consist thin metal films that are patterned in ways that make them useful as optical devices, and are often referred to as "Plasmon Optics". SPP structures can be used to manipulate electromagnetic waves in ways impossible with conventional optics, or even photonic bandgap materials, also known as photonic crystals, made with dielectric materials only. Different metals support surface plasmons in different wavelength ranges: aluminum in the UV, gold, silver and copper in the visible, different compounds such as indium tin oxide (ITO) in the infrared. The film thickness is usually a few tens of nanometers.

These requirements in terms of metal and film thickness are not compatible with the metallization technology used on the front-side of the wafers. Even though aluminum and copper are suitable metals, the film thickness is just not compatible with the thickness of the metal lines or vias used to interconnect circuit elements. Therefore, it is only possible to make SPP structures optimized for optical purposes on the back of a SOI wafer.

Certain particular combinations of metal, film thickness, size of the pattern, pitch of the pattern, and dielectric that the metal interfaces with, result in remarkable optical properties such as:

1. Transmission of electromagnetic waves through sub-wavelength holes in metal films, with an optical transmittance up to several orders of magnitude larger than what "small-hole" diffraction theory predicts. The zero order transmission spectra reported are characterized by well-defined transmission maxima at wavelengths up to ten times that of the hole diameter with efficiencies exceeding unity.
2. Wavelength filtering can be achieved with 2D metal grids.
3. Polarization filtering can also be achieved with 2D metal grids.

4. Focusing of electromagnetic waves on spots with lateral dimensions much smaller than the wavelength of the radiation.
5. The wavelength of resonance can be tuned by changing the dielectric interfacing with the metal.

All these unusual characteristics of SPP structures can be employed separately or together to improve performance and/or functionality of image sensors across the UV, Visible, SWIR, MWIR, and LWIR, wavelength ranges.

The present invention hereby discloses a new device concept made of SPP structures, hereafter designated as "SPP Light-Funnel" that can have at least two different implementations. Both implementations can be arranged into 1D or 2D arrays, and monolithically integrated with image sensors through the process architecture described below. For the reasons already explained in the present disclosure, back-side illuminated CMOS image sensors made on TF-SOI or TF-GeOI substrates, are the preferred image sensor technology for the incorporation of the new SPP Light-Funnel.

In a conventional single-chip digital imaging camera, the sensor matrix is placed at the focal plane of the image formed by the lens system. Using a 2D array (matrix) of SPP Light-Funnel elements, the photons present in the focal plane, are not coupled directly into the light sensors (photo-diodes) in the sensor matrix, but instead are coupled first to the individual SPP Light-Funnel elements, which then guides and couples the photons to the photo-diodes. Adding this intermediate step in coupling the image, formed at the focal plane by the lens system, enables a few unique features that are described below in more detail.

In a system incorporating the SPP Light-Funnels it is possible to define two different types of pixels:
1. "Sensor Pixels"—the light sensor elements containing one or more photo-diodes, and a number of transistors.
2. "SPP Pixels"—the SPP Light-Funnel elements that can be arranged in an array at the image plane of a lens.

In both implementations described below, both Sensor Pixels and SPP Pixels, can be squared, rectangular, hexagonal, or any other geometrical shape that lends itself to repeatability and occupies the full area of the focal plane. Each of these SPP Pixels can be associated one or more photo-diodes belonging to the same Sensor Pixel. In a typical configuration, there will be a one-to-one relationship between the Sensor Pixels and the SPP Pixels. Both kinds of pixels share the same geometry, size and pitch, and both types of pixels are arranged into arrays with the same number of rows and columns.

Figure 5:
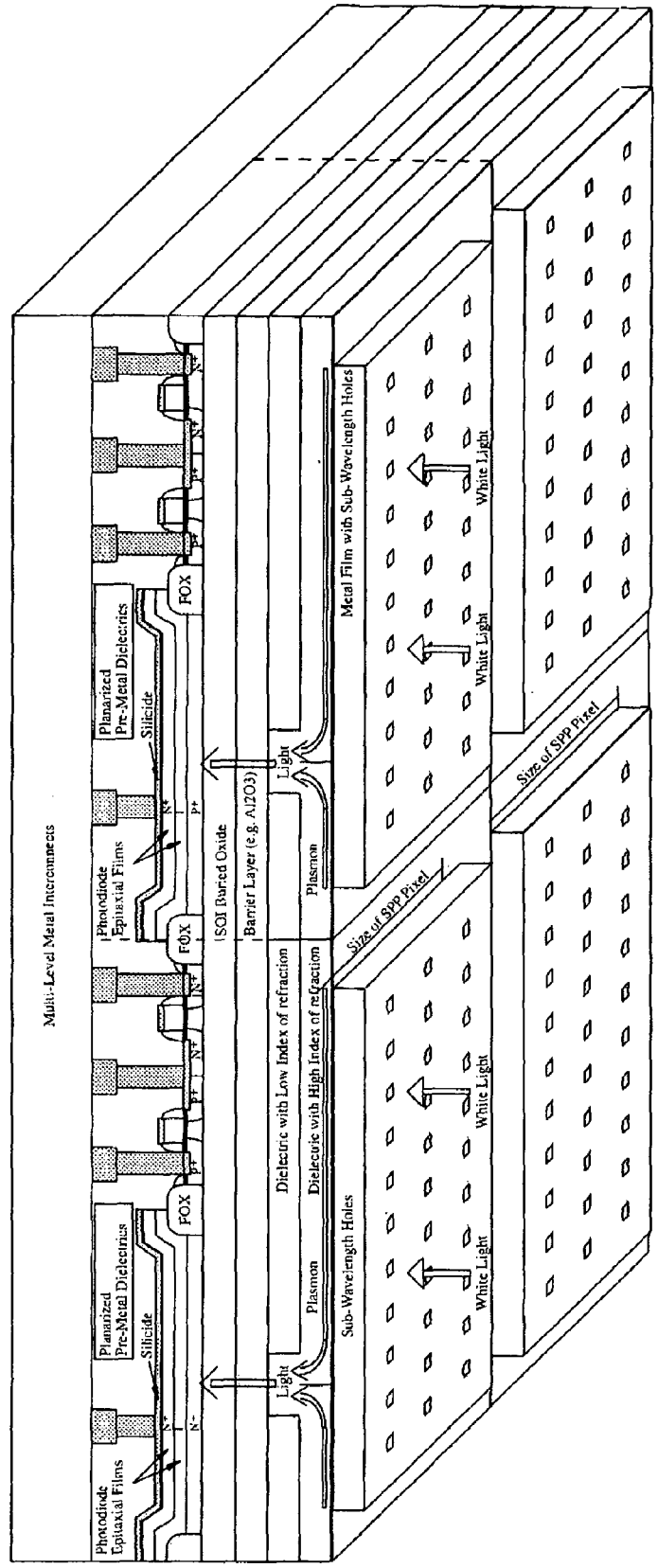
FIG. 5 shows a schematic representation of the first implementation of the SPP Light-Funnel, in which the SPP Light-Funnel must be in close proximity to the photo-diodes.

FIG. 5 illustrates SPP Light-Funnel elements having an array of squared pixels having in cross-section a T-shape. The top view of the SPP Light-Funnel shows of a matrix of thin metal films. Each SPP Pixel is a metal film, isolated from the adjacent patterned metal films (adjacent SPP Pixels). The SPP Pixels may or may not be patterned. Patterning of the SPP Pixels is one method of tailoring the wavelength of surface plasmon resonance. Another method of tuning the wavelength of surface plasmon resonance is the selection of dielectric layers to be interfaced with the metal films. Different dielectric constants will induce changes in the wavelength of resonance.

If the light coupled to the bottom of the "T" is not wavelength-filtered by one of the methods described above, separate wavelength filtering elements can be used in conjunction with this implementation of the SPP Pixel. For example, conventional color filters could be formed on the SPP pixels, either directly on the metal films or separated by a thin dielectric film. It should be kept in mind that other structures, such as gratings can also be deposited on top of the metal surface, improve the coupling between the illumination filed and the surface plasmon, and provide wavelength-filtering.

When light having a wavelength corresponding to the wavelength of resonance of the surface plasmon impinges on the SPP pixel, that excitation propagates from the top metal film to the bottom of the hole in the material with low dielectric constant. The bottom of that hole is positioned sufficiently close to a photo-diode, so that there is a highly efficient coupling of the electromagnetic energy. Adding a second hole under the same metal film square, allows the coupling to be made to two photo-diodes. Adding more holes under the top metal film of a single SPP Pixel enables the coupling of the resonant surface plasmon to more photo-diodes.

The metal film is positioned at the image plane of a lens, and defines the area of the SPP Pixel, which is determined by two factors:
1. The resolution of the lens producing the image plane. For diffraction-limited optics, the ultimate limit for the resolution is the wavelength of light being focused.
2. The minimum Sensor Pixel size possible to make on the front-side of the wafer. The minimum Sensor Pixel size is determined by the smallest possible photo-diode and by the number and size of the CMOS devices inside each pixel. In general, more advanced CMOS technology will allow Sensor Pixels with smaller size.

The correctness of the physics for this implementation of the SPP Light-Funnel, and the verification of its working principles can be found in the simulation work by Olivier J. F. Martin, "Surface plasmon illumination scheme for contact lithography beyond the diffraction limit", Microelectronic Engineering, No. 67–68 (2003), pp. 24–30. These simulations also indicate that the coupling of the surface plasmon generated by the "SPP Light-Funnel" to an absorbing medium is only possible provided an extremely short distance, of the order of 10 nm, between the SPP Light-Funnel element and that absorbing medium, which in the context of the present invention is a photodiode.

The limitation on the distance between the "T" structure constituting the SPP Pixel and the photo-diode belonging to the corresponding Sensor Pixel is very strict. This rules out front-side illuminated image sensors made on bulk substrates, because on one hand the SPP Light-Funnels would have to be positioned extremely closed to the photo-detectors, and on the other hand the opposite metal surface needs to be in the image plane of the lens system, which would not be compatible with the existence of several metallization layers, because of the thickness or height that such layer stack creates. Therefore this implementation seems to absolutely require back-side illuminated image sensors, which are best implemented with photo-diodes fabricated on TF-SOI or TF-GeOI wafers.

Figure 6:
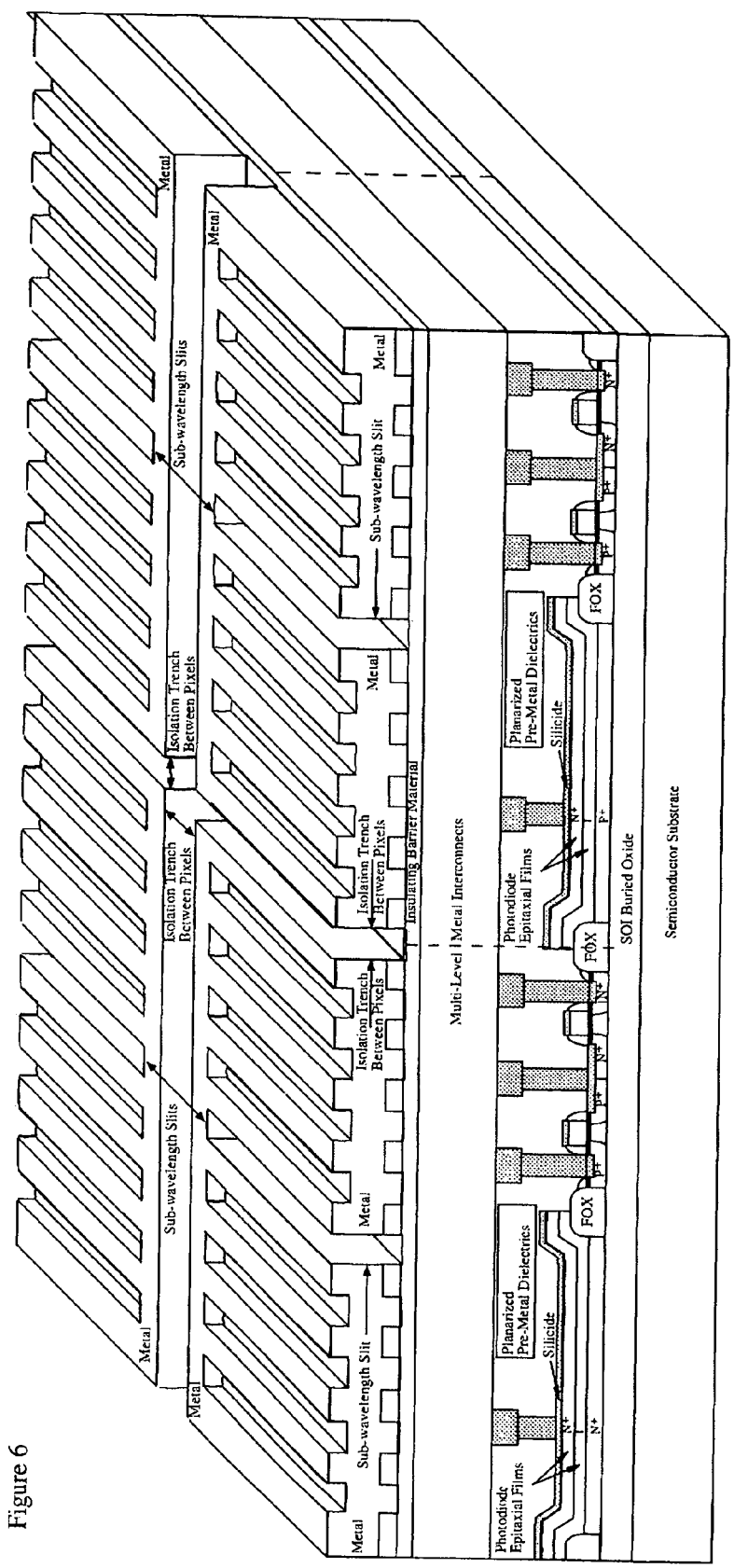
FIG. 6 shows a schematic representation of the second implementation of the SPP Light-Funnel, in which the SPP Light-Funnel can be distant from the photo-diodes.

FIG. 6 illustrates an implementation showing an array of squared pixels having in cross-section a rectangular shape. A top view of the SPP Light-Funnel shows of a thin metal film patterned into a matrix of pixels. Each pixel is a patterned metal film, isolated from the adjacent patterned metal films (adjacent pixels). The pattern on the metal film constituting a pixel selects the wavelength of resonance. The central sub-wavelength slit/hole and the side grooves determine the wavelength to be transmitted, and also the divergence of the transmitted light beam. The larger the number of the side grooves, the more collimated the beam will be. For optimized structural parameters of the patterned metal film, there will be a transmitted light beam with a cross section that is much smaller than the wavelength. That light beam is then absorbed by photo-diodes fabricated on the front-side of the TF-SOI or TF-GeOI wafer. The top surface of the structured metal layers is positioned at the focal plane and defines the pixel area. This implementation does not require an extreme physical proximity between the SPP Light-Funnel and the photo-sensor material. Therefore, this SPP Light-Funnel can be used with front-side illuminated image sensors.

Both implementations of the SPP Light-Funnel concept result in the following novel features:

1. The transmitted light beam can be wavelength-filtered by the patterning of the metal films (SPP Pixels), rather than by having to deposit a different material for each wavelength to be filtered.
2. Wavelength filtering by SPP structures can be engineered for any wavelength range and has a much narrower bandwidth than conventional color filters for visible or invisible radiation.
3. Adjacent, but isolated, metal films (SPP Pixels) can have different patterns and therefore transmit different wavelengths (visible or invisible).
4. The transmitted light beam can be polarization-filtered by the patterning of the metal films (SPP).
5. Adjacent, but isolated, metal films (SPP Pixels) can have different patterns and therefore transmit different polarizations.
6. The cross-section of the transmitted light beam can be much smaller than the wavelength.
7. The area of the photo-diodes only needs to be slightly larger than the cross section of the transmitted light beam. Therefore the area of the photo-diodes can be much smaller than the area of the SPP Pixels.
8. For a given photon flux, the number of photons absorbed by the photo-diodes is determined by the area of the SPP Pixel, not the area of the photo-diodes.
9. With the SPP Light-Funnel, the Fill Factor, defined as the ratio between the area of the photo-diodes and the total area of the Sensor Pixel, becomes irrelevant.
10. Everything else being equal, the signal-to-noise ratio of the photo-generated signal increases with ratio of the area of the SPP Pixel over the area of the photo-diodes.
11. SPP structures have been reported to exhibit no reflection of the incident beam. This makes SPP structures, including the SPP Light-Funnels, perfect anti-reflection coatings.
12. SPP structures have been reported to exhibit transmittance above unity, thereby realizing an amplification of the incoming optical beam.

Realizing wavelength filters with SPP structures has many advantages over conventional color filters. Perhaps the most important advantage is that SPP structures can provide wavelength-filtering in regions of the spectrum for which conventional color filters offer poor performance or do not exist, and do so with much higher spectral purity (filter has narrower bandwidth), which is a very important factor in color filtering/reproduction in the visible range. The spectral purity of wavelength-filters made with SPP structures should be compatible with the requirements of the filters needed for hyper-spectral imaging. Because it is straightforward to fabricate many different wavelength-filters side-by-side, SPP wavelength-filtering structures are an ideal solution for multi-spectral imaging, covering the UV, Visible, SWIR, MWIR and LWIR spectral ranges. In addition, the transmittance of the selected wavelengths can be above unity, in sharp contrast with the usual problems of reflection and absorption found in conventional wavelength filters. All these characteristics make wavelength-filtering with SPP structures to be much simpler and cost effective than conventional solutions.

The advantages of using SPP structures are even more important for polarization filtering, since conventional technology is not suitable for monolithic integration of the "polarization filters" with image sensors.

Some of the photo-detectors suitable to sense LWIR wavelengths are Heterojunction Internal Photoemission (HIP) devices, such as those described in PCT/EP/03/10346, which are characterized by fairly large dark currents. In addition, the typical LWIR detection is characterized by very low signals. These two factors lead to quite low Signal-to-Noise Ratio (SNR). The SPP Light-Funnel can by itself significantly increase the SNR of LWIR detection because it enables the area of the photo-detector to be much smaller than the area of the pixel. This results in a sharp reduction of the dark current, which is a leakage current that is proportional to the area of the photo-detector, while the signal is gathered by a patterned metal film (SPP Pixel) that is much larger than the photo-diode. Therefore, maintaining the signal and reducing the noise (dark current) leads to an increase in the SNR that is proportional to the logarithm of the ratio of the area of the SPP Pixel over the area of the photo-detector.

A simple calculation can provide an idea of the impact of "funnel effect" on the Detectivity: scaling the photo-diode area from 100 $\mu m \times 100$ $\mu m$ to an area of 0.12 $\mu m \times 0.12$ $\mu m$ results in a factor of ~695,000 reduction in dark current, while keeping the optical signal constant. Detectivity, being proportional to the inverse of the square root of the dark current, increases by a factor of ~833. From this point of view, the SPP Light-Funnel can be seen as a "noise-reduction device" because it enhances the signal-to-noise ratio of the photo-detection by reducing the stand-by current of the photo-diodes. This is applicable to HIP devices as well as to PIN devices, and therefore it can be applied to light and image sensing across the visible, UV, and IR ranges.

In addition there are also cost-related advantages, since the defectivity inherent to the fabrication of the photo-detectors, which typically are epitaxially grown devices, is exponentially dependent on the "device area". Therefore, reducing the photo-detector "device area" results in fewer defects, leading to increased yields and reduced costs.

Monolithic Integration of Image Sensor and Superlenses

As mentioned in the previous section, the resolution of the entire imaging system is dependent on two fundamental factors:

1) How small the Sensor Pixel can be;
2) The resolution of the lens system.

In conventional imaging systems, the image sensor and the lens group are two very different components, involving very different technologies and thus fabricated separately. Conventional image sensors and conventional lenses are, by their nature, impossible to be monolithically integrated.

Recent developments in optical physics have the potential to revolutionize the performance as well as the methods of manufacturing lenses. The new concept is often referred to as a "Perfect Lens" or "Superlens", which is planar or slab-like and has a resolution smaller than the wavelength of light. Sub-wavelength resolution is achievable by constructing optical systems capable of handling optical "evanescent waves" or the optical "near field". Conventional lenses act only on the far field electromagnetic waves. The near filed radiation contains the sub-wavelength detail requires amplification or resonances which are not possible with conventional lenses.

Several alternative implementations of "Superlenses" have been proposed. Some proposals are based on "Negative Refraction", which can be achieved with materials having negative refraction index. It has also been shown that negative refraction can be realized without negative refraction index materials, for example with metallodielectric photonic crystals.

There is also been a proposal for a negative refraction lens with optical amplification of the near field waves that can compensate the unavoidable losses due to the non-ideality of real materials and devices.

An altogether different approach has been proposed to achieving the Superlens sub-wavelength resolution with optical phase conjugation. This concept also enables a planar lens, requiring sheets of non-linear or active materials capable of wave-mixing.

Even though the several conceptual implementations of superlenses propose different technical solutions to the question of manipulating evanescent waves, they have a few characteristics in common:
1. The superlens is capable of sub-wavelength resolution,
2. The superlens is planar or slab-like,
3. The superlens can be manufactured with techniques that are used by microelectronics, rather than the techniques employed to make conventional lenses.

The present invention hereby discloses a fabrication architecture for the monolithic integration of an image sensor matrix and a superlens. In particular the proposed fabrication architecture highlights the monolithic integration of a superlens with back-side illuminated CMOS image sensors made on TF-SOI or TF-GeOI substrates, having Sensor Pixels smaller than the wavelength of the light to be absorbed.

The proposed architecture can also have "SPP Light-Funnel" elements or "SPP Pixels" placed at the image plane, in a manner discussed in the previous section of the present invention. This enables "SPP Pixels" with sub-wavelength lateral dimensions.

Figure 7:
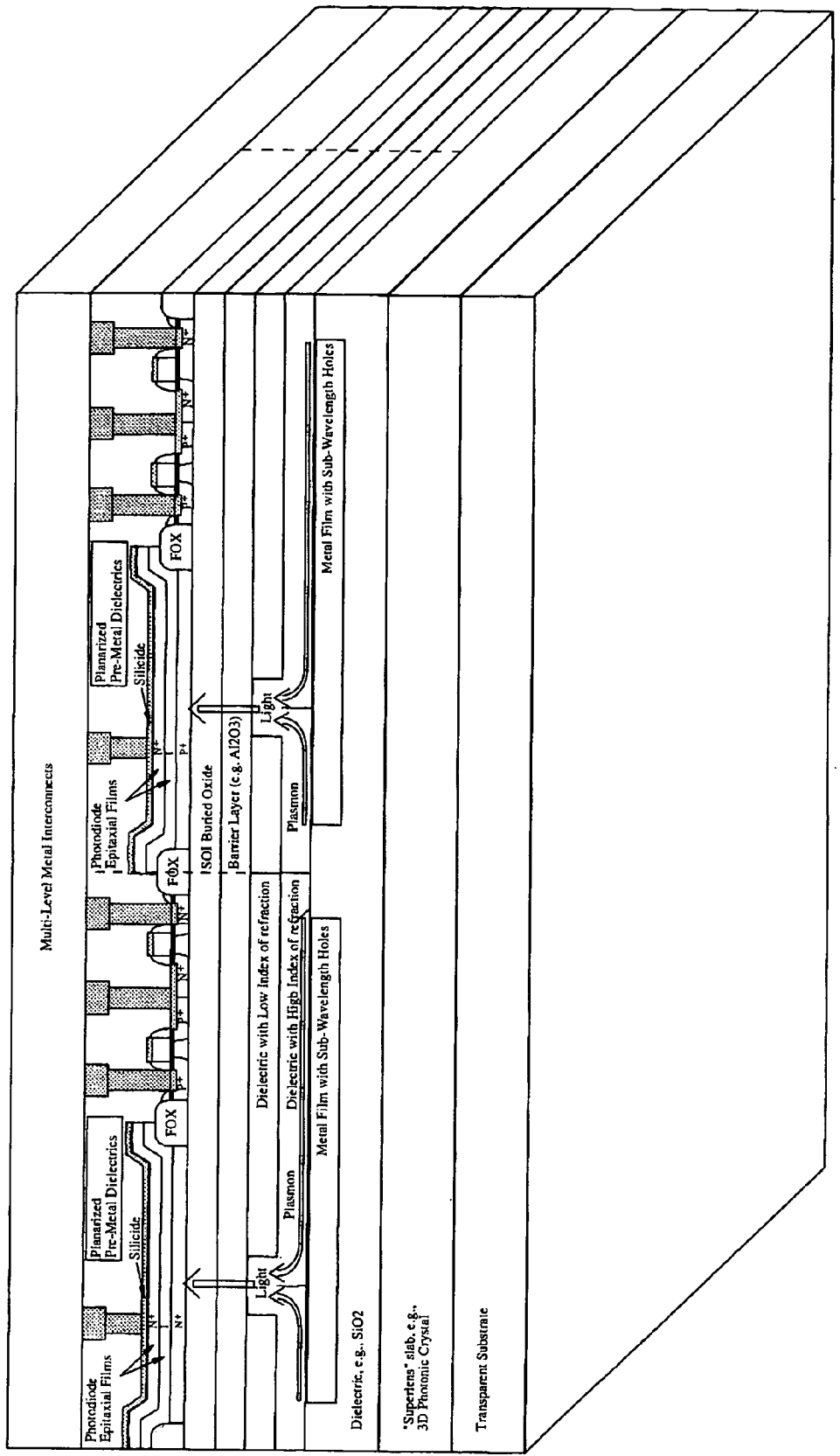
FIG. 7 shows a schematic representation of a slab-like superlens monolithically integrated with back-side illuminated Thin-Film SOI CMOS image sensors, and with SPP Light-Funnel fabricated according to the first implementation described in the present invention.

FIG. 7 shows a schematic representation of a slab-like superlens monolithically integrated with back-side illuminated Thin-Film SOI CMOS image sensors, and with SPP Light-Funnel fabricated according to the first implementation described in the present invention.

The fabrication of Superlens, monolithically integrated with back-side illuminated image sensors, can result extraordinary advantages in terms of size, weight, and cost of such system, compared to the conventional digital imaging systems, consisting of one of more image sensors, and a separated, diffraction-limited, lens group.

Optical systems designed for superlenses can emulate optical systems designed for conventional, diffraction-limited, lenses. Optical systems requiring a controlled variation of the distance between optical elements, as is the case for focusing and zooming for example, can also be implemented with the process architecture of the present invention, through the fabrication of suspended membranes that can be actuated by micro electromechanical actuators. The fabrication of such structures is presently a well-mastered technology.

Ultimately, the combination of very advanced SAM-APD sensors (as described in PCT/EP/03/10346) monolithically integrated with advanced CMOS devices (e.g. 45 nm design rules) made on TF-SOI or TF-GeOI substrates for back-side illumination, with SPP Light-Funnels and Superlens fabricated on the back of the buried oxide, enables the creation of sub-wavelength SPP Pixels and Sensor Pixels which are capable of capturing the fine detail of the near-field delivered by the Superlens. For example, for the longest wavelength in the visible, Red ($\lambda \approx 650$ nm), a resolution of $\lambda/3$ can be translated into pixels of approximately 0.20 µm×0.2 µm. The ability to make such small pixels encourages the fabrication of very large sensor matrices, in which an all electronic zooming can perform better than the zoom of conventional optical lenses, thereby avoiding the fabrication of MEMS elements to provide image magnification.

Process Architecture

The description given below of the process architecture for the monolithic integration of a "Superlens" with an image sensor matrix, assumes the pre-processing of the back-side illuminated CMOS image sensors made on TF-SOI or TF-GeOI, and also the pre-processing of optional SPP Light-Funnels.

The description starts immediately after the fabrication of the SPP Light-Funnels. All processing on the back-side is performed at a temperature low enough as not to interfere with any of the structures and materials present on the front-side of the wafer.

The fabrication process of a "Superlens", rather than making a converging single-lens, can be repeated a number of times in order to achieve a "Superlens-group" with functionality similar to that of groups of conventional lenses. In the description below a single "superlens" is targeted.

Fabrication Flows

Exemplary process flows are described below with reference to schematic drawings. In these drawings, it is to be noted that the layers and patterns are not drawn to scale.

Process Flow for the First Implementation of SPP Light-Funnel

Figure 8A:
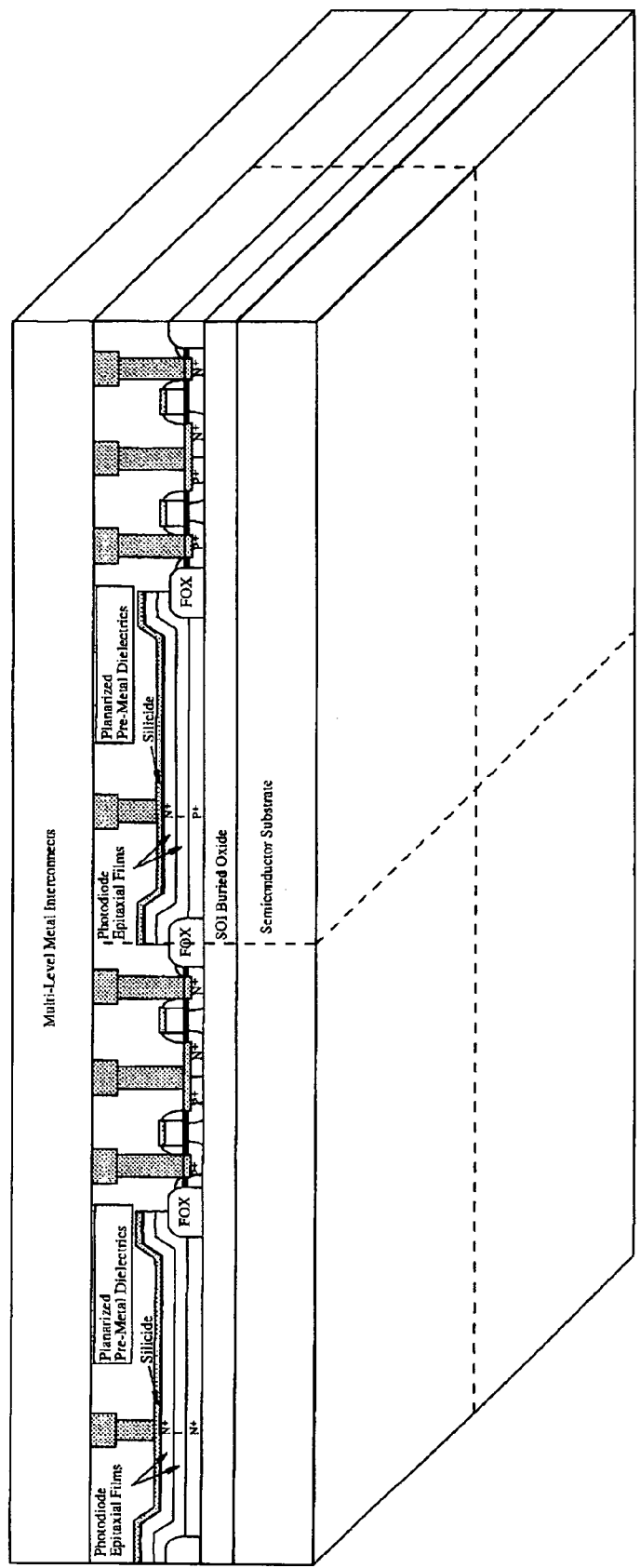

This exemplary process flow is for back-side illuminated CMOS image sensors made on TF-SOI or TF-GeOI substrates. Full processing of the front-side of the wafer, according to the exemplary process flow shown in PCT/EP/03/10346 for back-side illuminated image sensors (FIG. 8A).

The processing of the back-side begins with the removal of the bulk silicon under the buried oxide. The bulk silicon provides the mechanical support for the buried oxide and top silicon films, and for that reason the top side of the substrate needs to be (temporarily) attached to a mechanical support that is compatible with the subsequent processing.

Figure 8B:
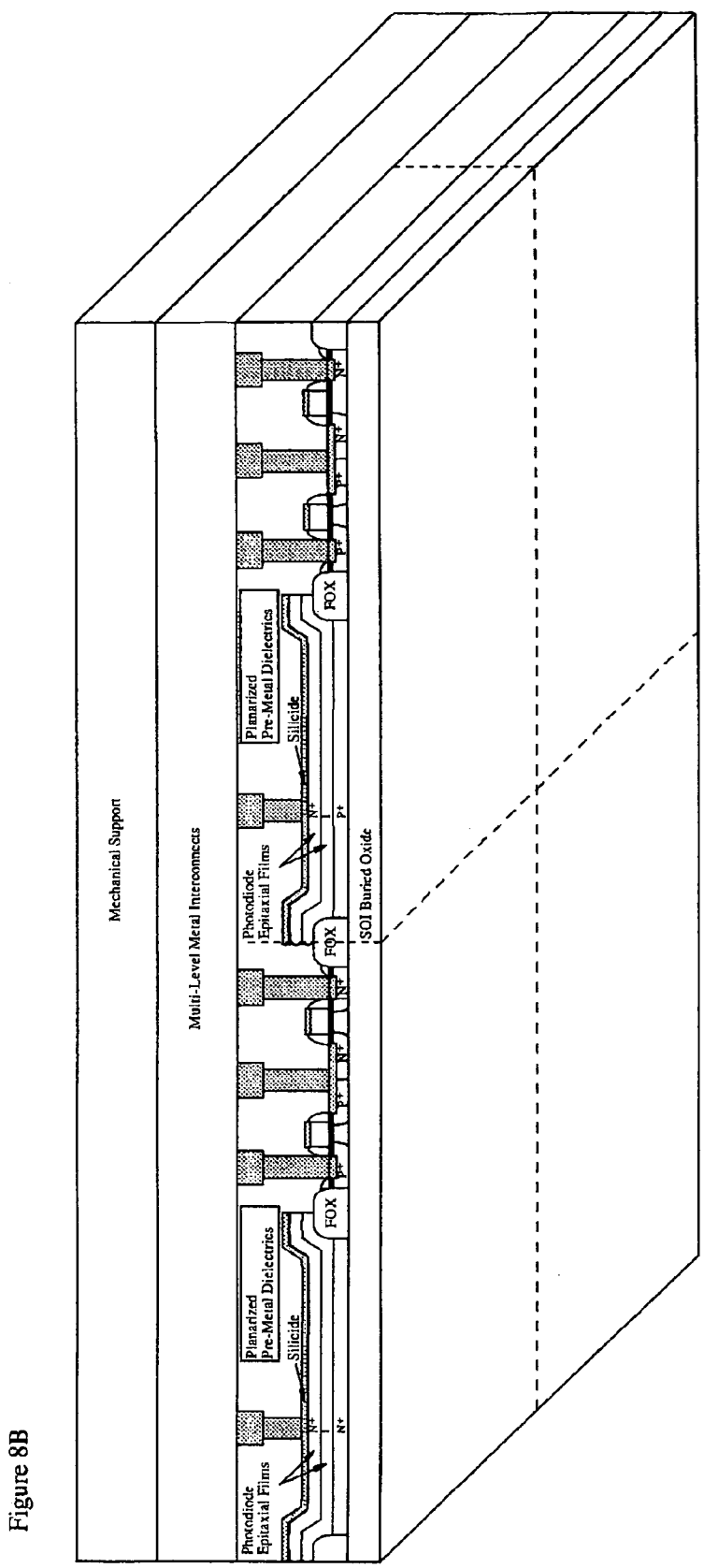

The removal of the bulk silicon can be achieved through wet etch, selective against the buried oxide. Several commonly used chemicals fulfill the requirements, including KOH for example. This step exposes the "marker layers" used the lithography tool to alignment the several masking steps used for micro-fabrication. Typically these "marker layers" are grooves etched into the substrate (bulk or SOI), which during processing get filled with materials such as $SiO_2$ and $Si_3N_4$, which will not disappear when the silicon bulk is etched away, and will be used for the alignment of the lithography steps to be performed on the back-side of the substrate (FIG. 8B).

"Barrier Material"

1) On the exposed surface of the buried oxide, it may be convenient to form a thin film of a chemically stable barrier material (preferentially with a very wide bandgap) to protect the buried oxide during the subsequent processing. Of the several possible materials, $Al_2O_3$ seems an excellent candidate. Naturally the deposition must take place at low temperature (FIG. 8C).

Figure 8D:
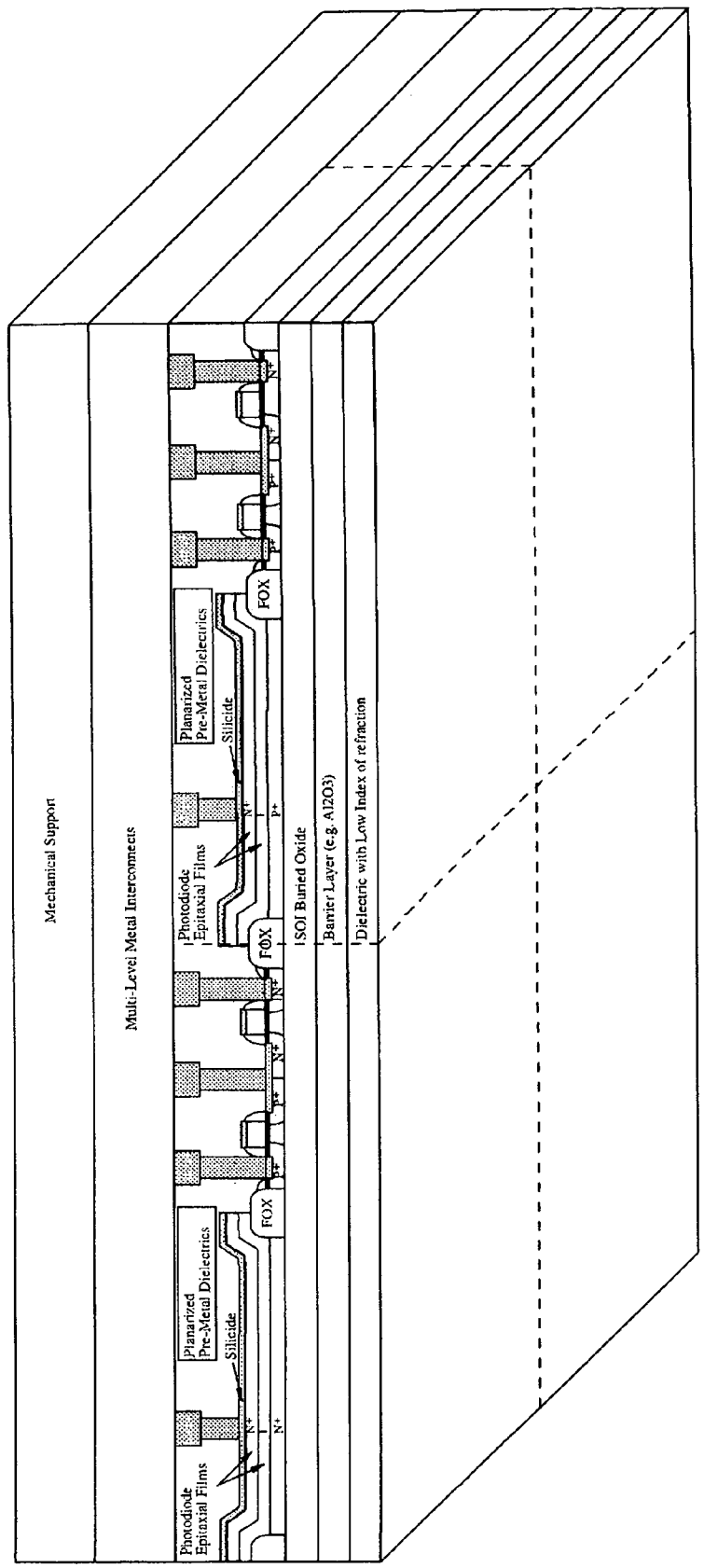
Figure 8E:
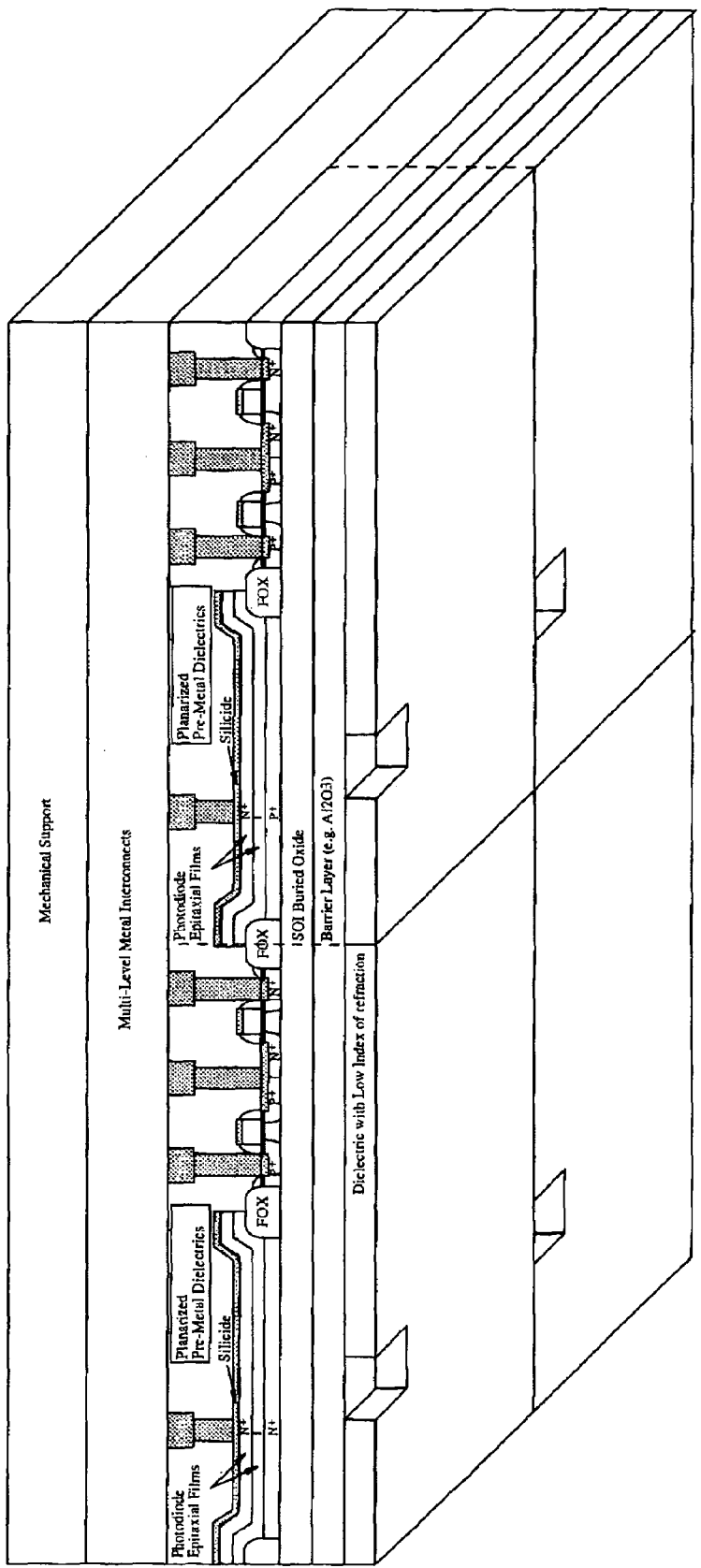

"Light-Concentrator"
2) Deposition (by whatever suitable method, such as PVD, CVD, Spin-On, etc), of a dielectric material with very small index of refraction for all the wavelengths of interest (FIG. 8D).
3) Photolithography, exposing (removing photoresist) only from areas where the material with very low index of refraction is to be removed;
4) Patterned etch of material with very low index of refraction, stopping on the $Al_2O_3$ barrier;
5) Photoresist strip and clean (FIG. 8E).

Figure 8F:
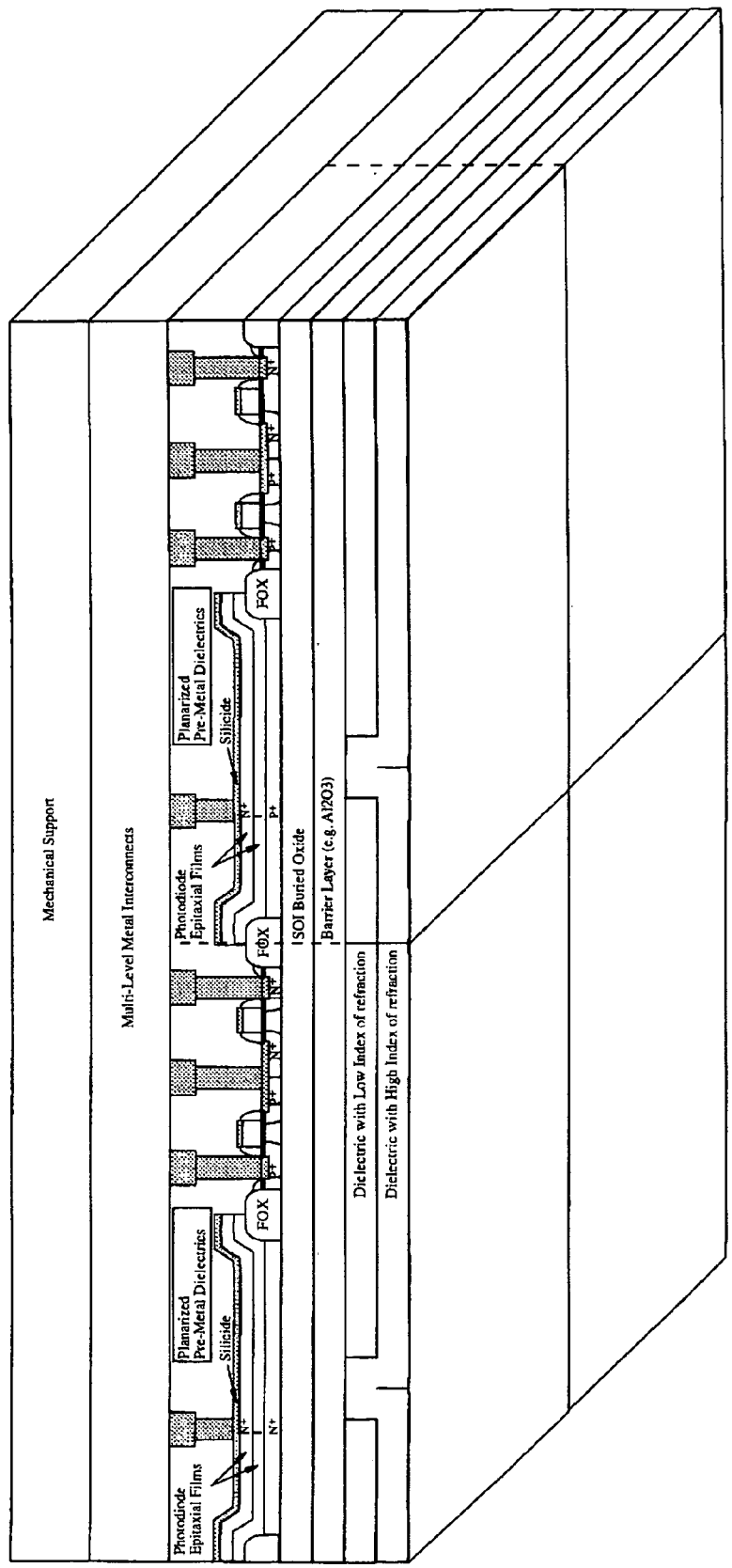
Figure 8G:
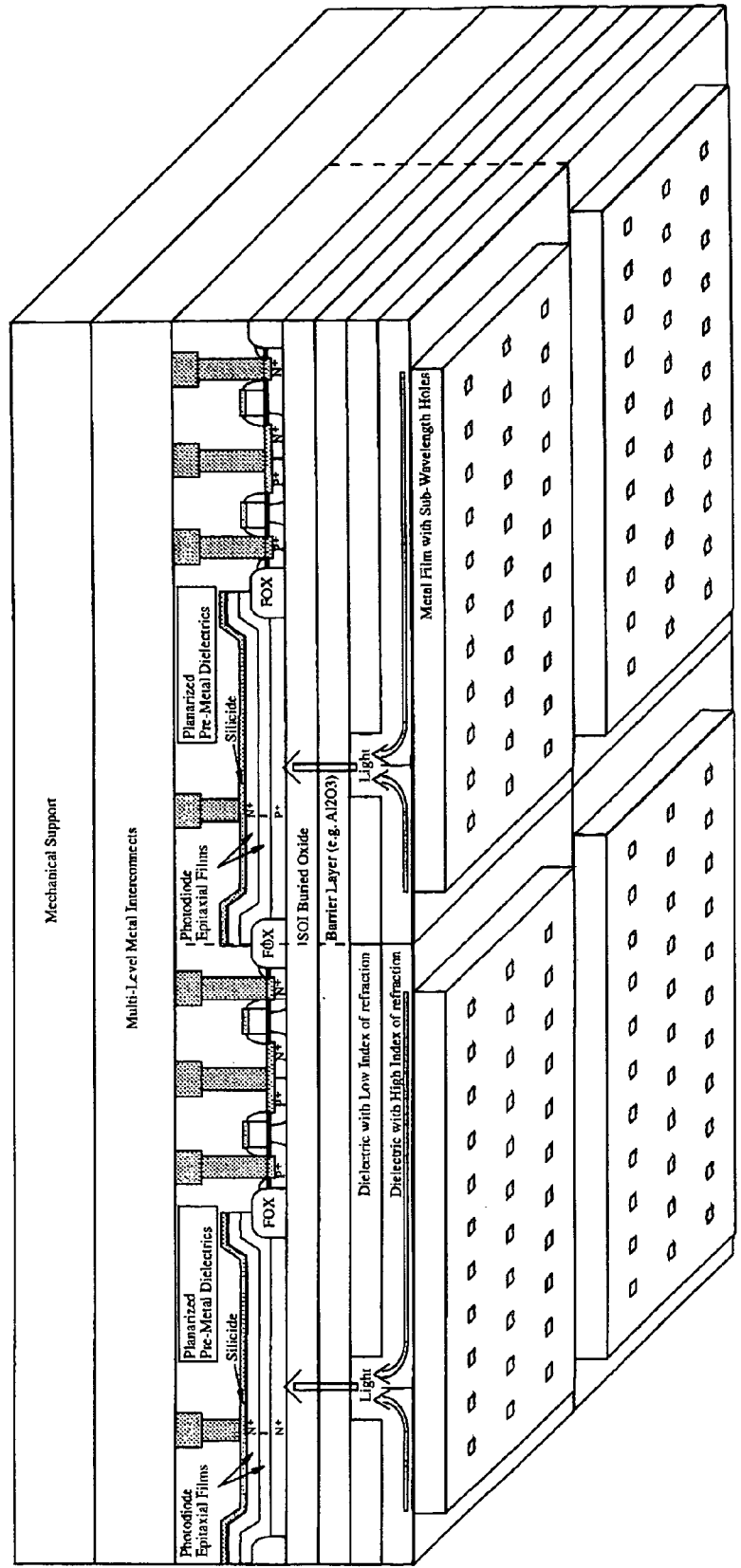
Figure 8H:
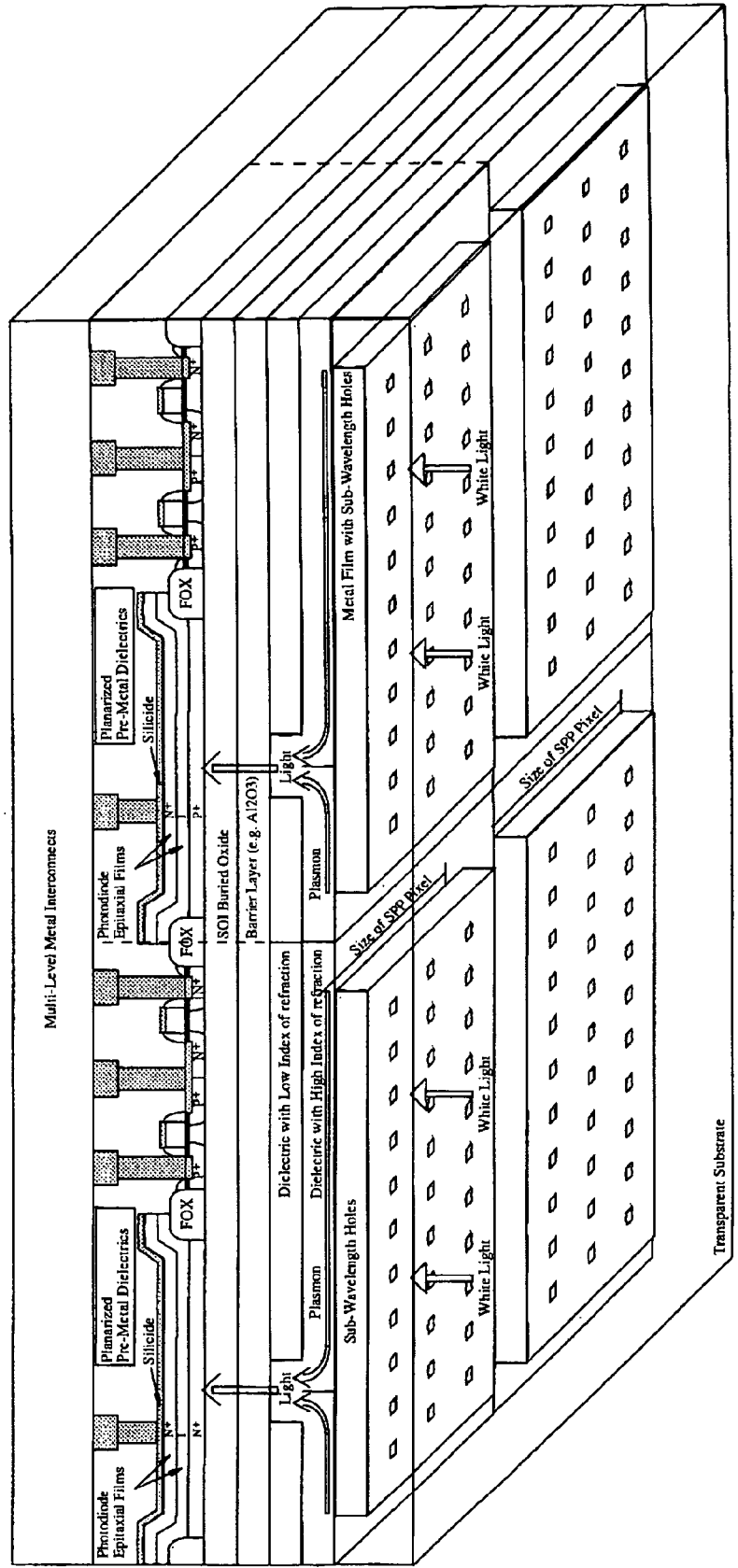

"Definition of Pixels and Wavelength Filters"
6) Deposition (by whatever suitable method, such as PVD, CVD, Spin-On, etc) of a dielectric material with an index of refraction for all wavelengths of interest that is substantially higher then that of the previously deposited dielectric (FIG. 8F);
7) Deposition of metal: composition and thickness suitable for all the wavelengths of interest;
8) Photolithography, exposing (removing photoresist) only from areas where the metal is to be removed;
9) Patterned etch of metal, stopping on the dielectric with high index of refraction;
10) Photoresist strip and clean (FIG. 8G);
11) Deposition (by whatever suitable method, such as PVD, CVD, Spin-On, etc), of a dielectric material suitable to be the interfacial material when bonding to a transparent substrate;
12) Low temperature wafer bonding to a transparent substrate, and subsequent detachment from mechanical holder at the front side of the wafer (FIG. 8H).

Processing equipment, processes, chemicals, etc., for this sort of processing has become more common because of the fabrication of SOI substrates through wafer bonding, and because of the 3D stacking of integrated circuits. The fabrication of SOI substrates involves only layers without any devices made on them. However, for the 3D staking of integrated circuits it is essential to have high precision alignment between the several wafers or individual IC being stacked.

Process Flow for the Second Implementation of SPP Light-Funnel

Figure 9A:
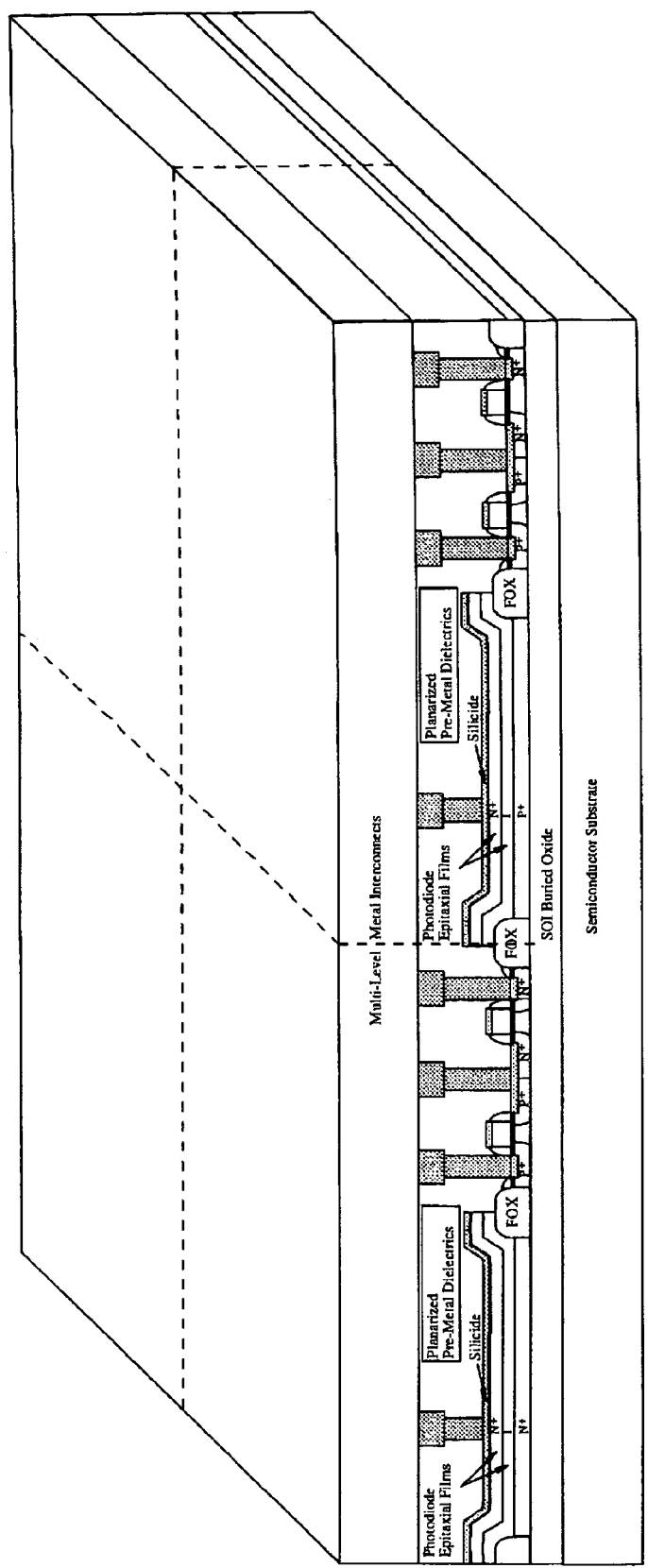
FIGS. 9A to 9H, show an exemplary Process Flow for the Second Implementation of the SPP Light-Funnel.

This exemplary process flow is for front-side illuminated CMOS image sensors made either on TF-SOI or TF-GeOI substrates, or on bulk substrates. Full processing of the front-side of the wafer for front-side illumination image sensing. The ideal doping and heterojunction profiles of the photo-diodes are defined in PCT/EP/03/10346 (FIG. 9A)

Figure 9B:
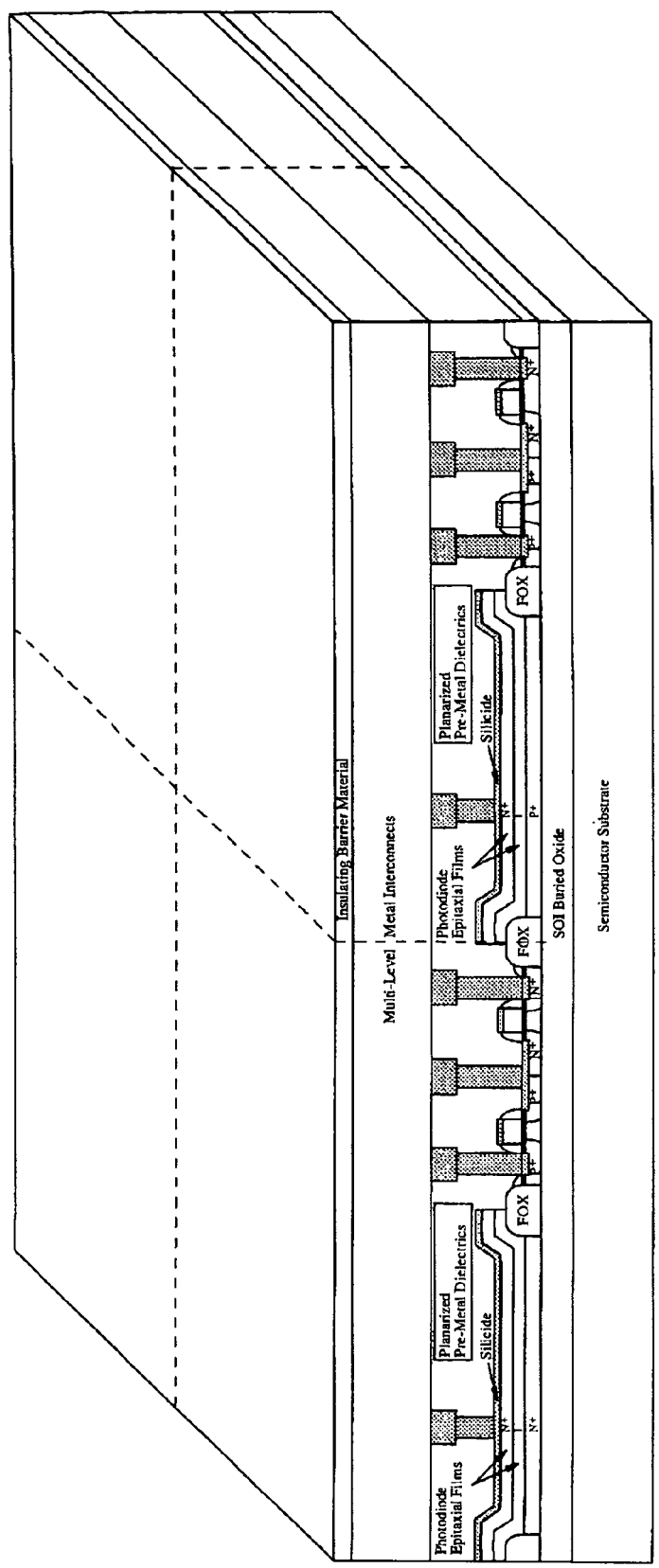

"Barrier Material"
1) After the fabrication of the last metal level for interconnects, an insulating film is deposited. The thickness of this film is not critical, for example one micrometer. The insulator film should be a chemically stable barrier material (preferentially with a very wide bandgap) that will not react with the metals or dielectrics under it, nor with the metal s or insulators to be deposited on it. The temperature of deposition must be sufficiently low to be compatible with the materials already present. This material can be for example SiO2 or Al2O3 (FIG. 9B).

Figure 9C:
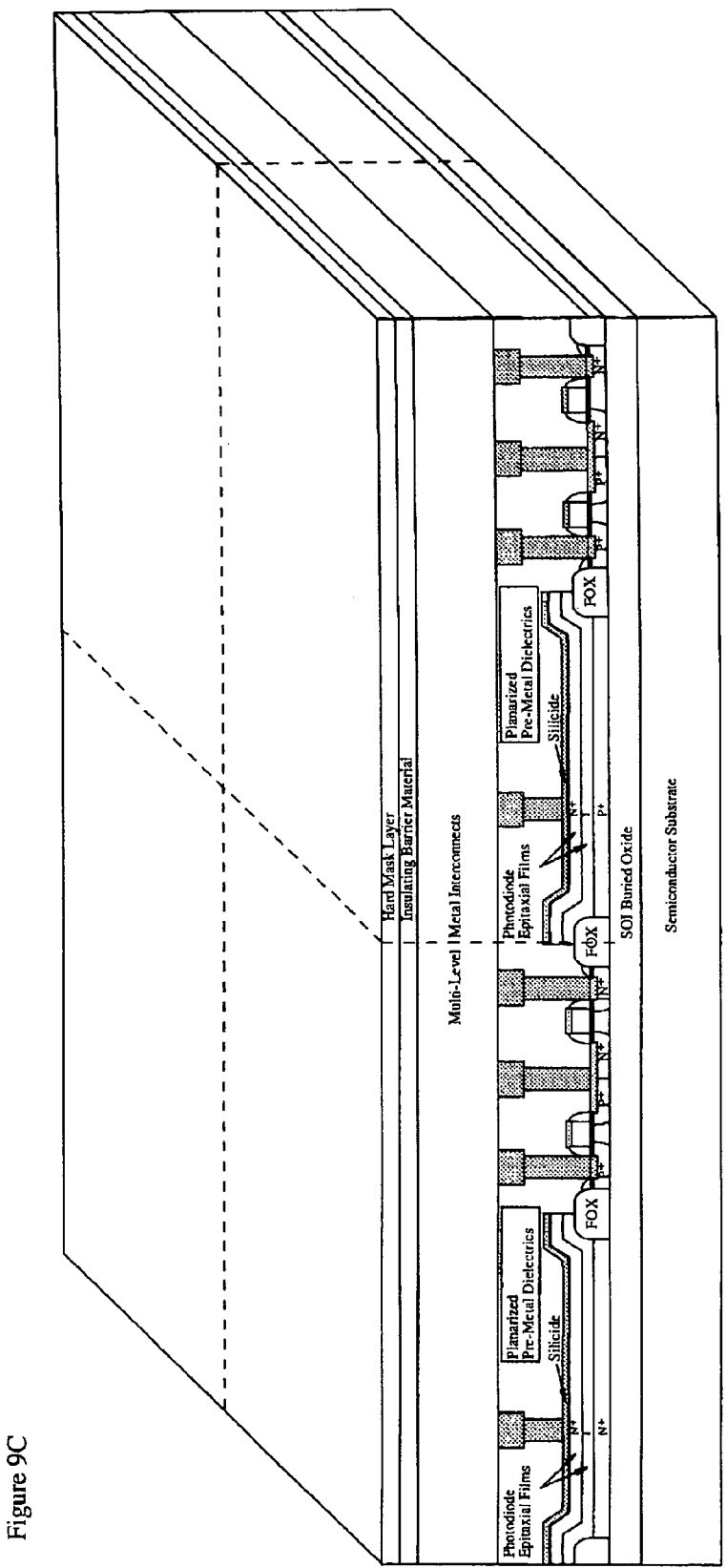
Figure 9D:
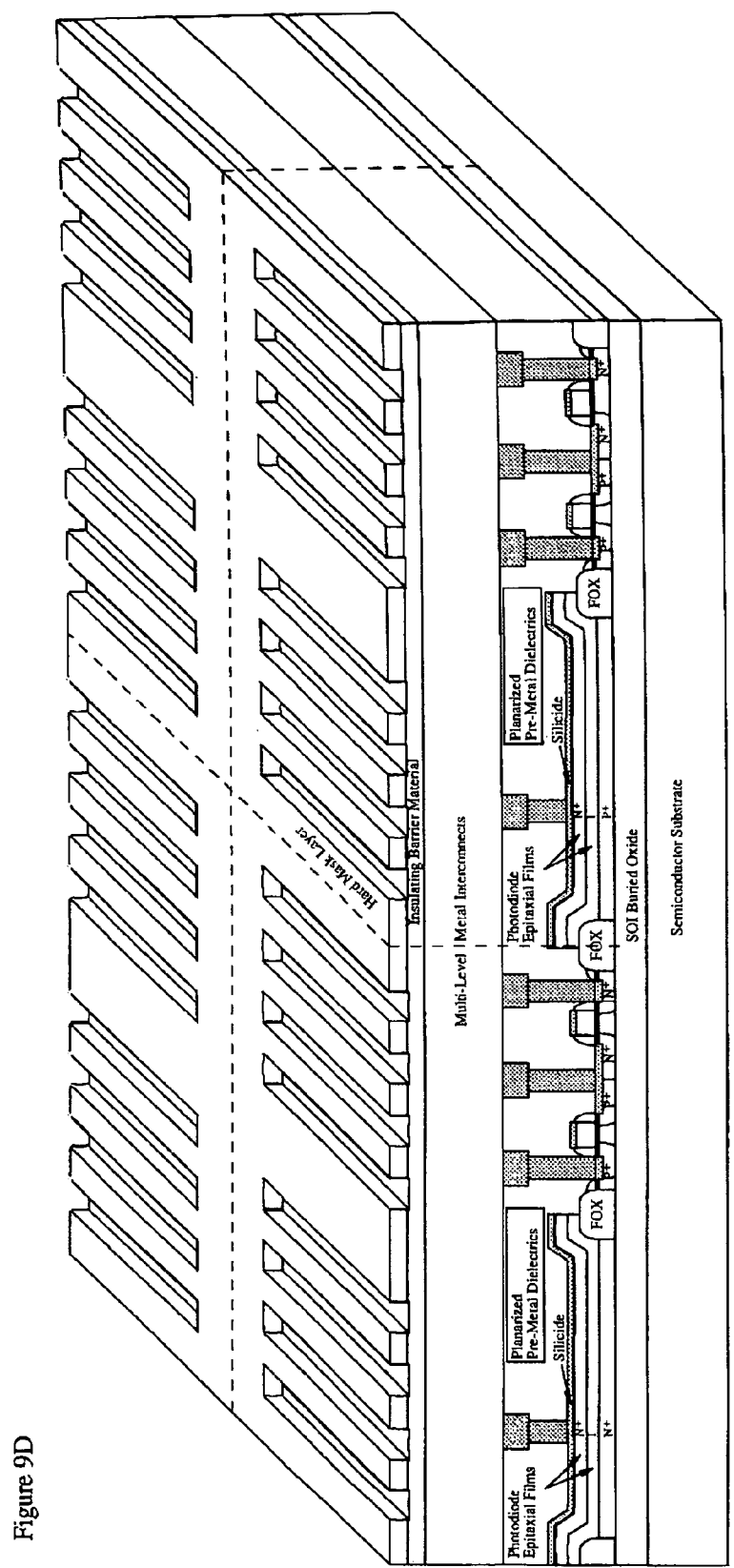

"Output Corrugation"
2) Deposition (by whatever suitable method, such as PVD, CVD, PE-CVD, etc), of a dielectric material whose thickness matched the depth of the corrugation of the bottom surface of the metal film, which is the "exit side" for the light beams. This insulator film—a hard mask layer—should be easy to etch selectively against the "barrier material" deposited in the last step. This material can be for example Si3N4 (FIG. 9C);
3) Photolithography, exposing (removing photoresist) only areas where the material is to be removed;
4) Patterned etch of material with very low index of refraction, stopping on the barrier material;
5) Photoresist strip and clean (FIG. 9D).

Figure 9E:
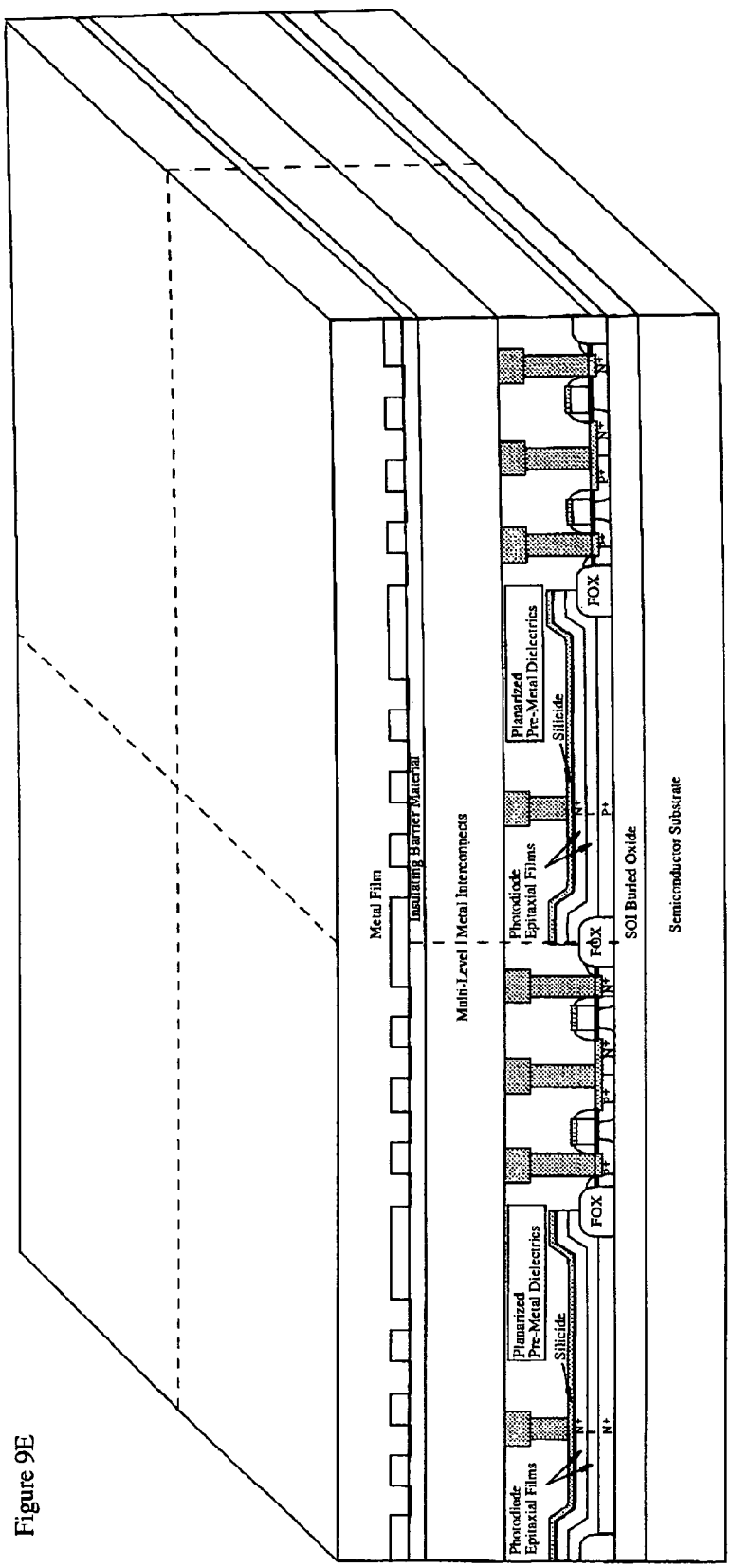
Figure 9F:
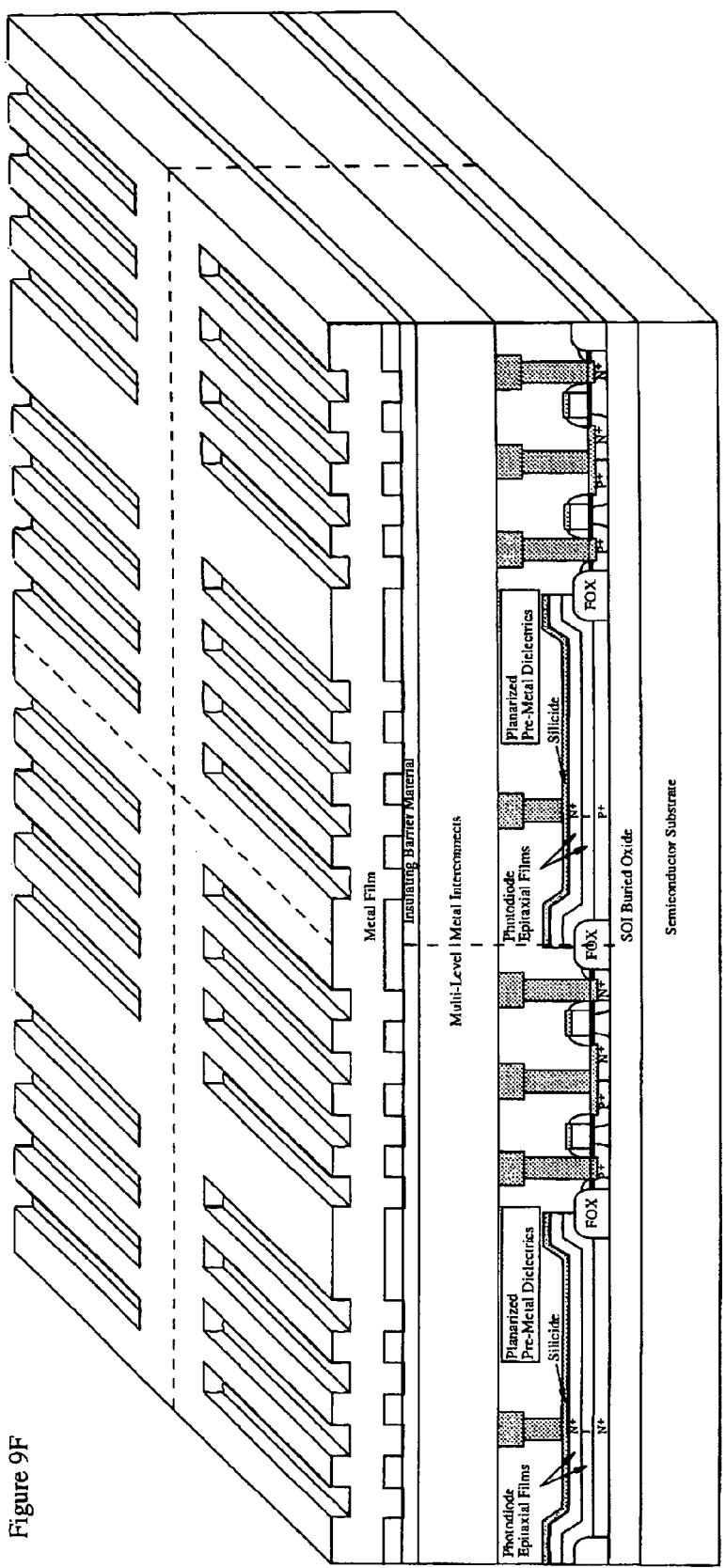

"Input Corrugation"
6) Deposition, by PVD for example, of a suitable metal film, such as silver or gold, with a thickness defined by the desired optical properties. This thickness is always much larger than the sum of the depths of the "input corrugations" and "output corrugations" (FIG. 9E);
7) Photolithography, exposing (removing photoresist) only areas where the metal is to be removed;
8) Patterned etch of metal stopping at the depth desired for the corrugations;
9) Photoresist strip and clean (FIG. 9F).

Figure 9G:
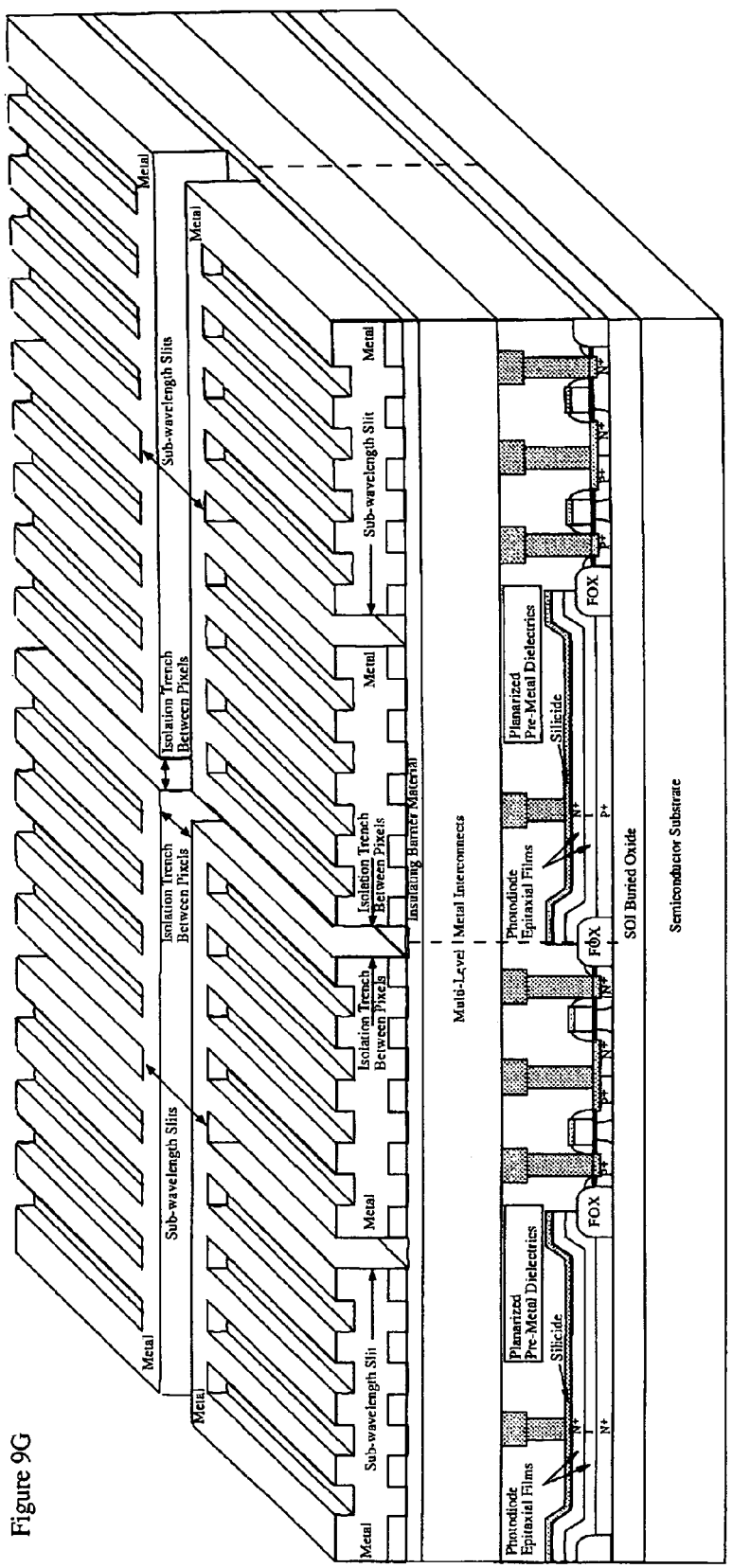
Figure 9H:
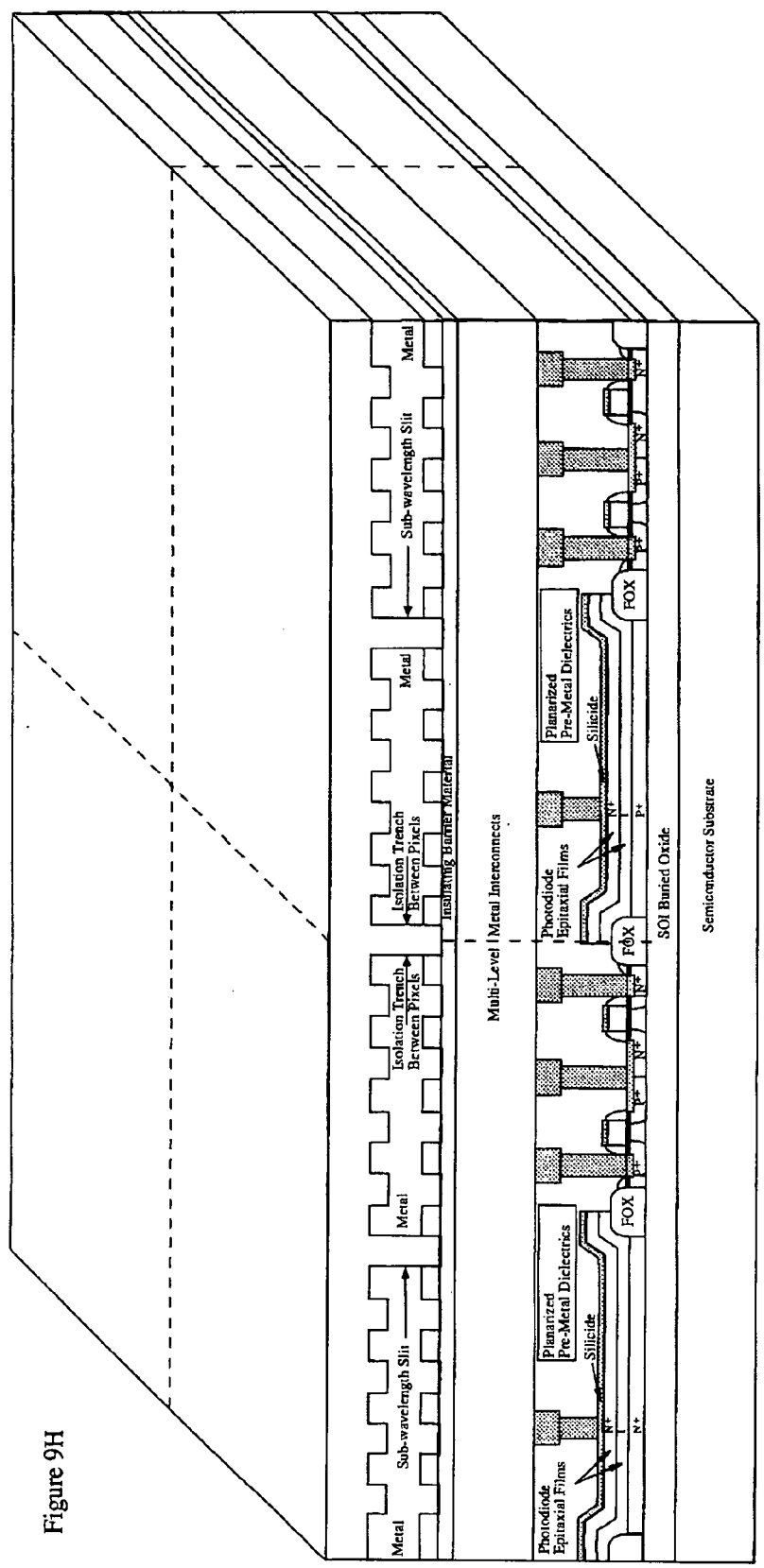

"Central Hole/Slit & Pixel Isolation"
10) Photolithography, exposing (removing photoresist) only areas where the metal is to be removed;
11) Patterned etch of top dielectric film, entire metal film thickness, stopping at the "barrier material" deposited before the metal layer. This etch defines the central hole/slit and defines individual pixels, i.e., isolated regions of dual-side corrugated metal films with central hole/slits;
12) Photoresist strip and clean (FIG. 9G);
13) Deposition (by whatever suitable method, such as PVD, CVD, Spin-On, etc), of a dielectric material suitable to be the interfacial material to the metal underneath. This material fills up the trenches in the metal (corrugations) and planarizes the surface (FIG. 9H);
14) Deposition of passivation layer.

Process Flow for the fabrication of Superlens

Figure 10A:
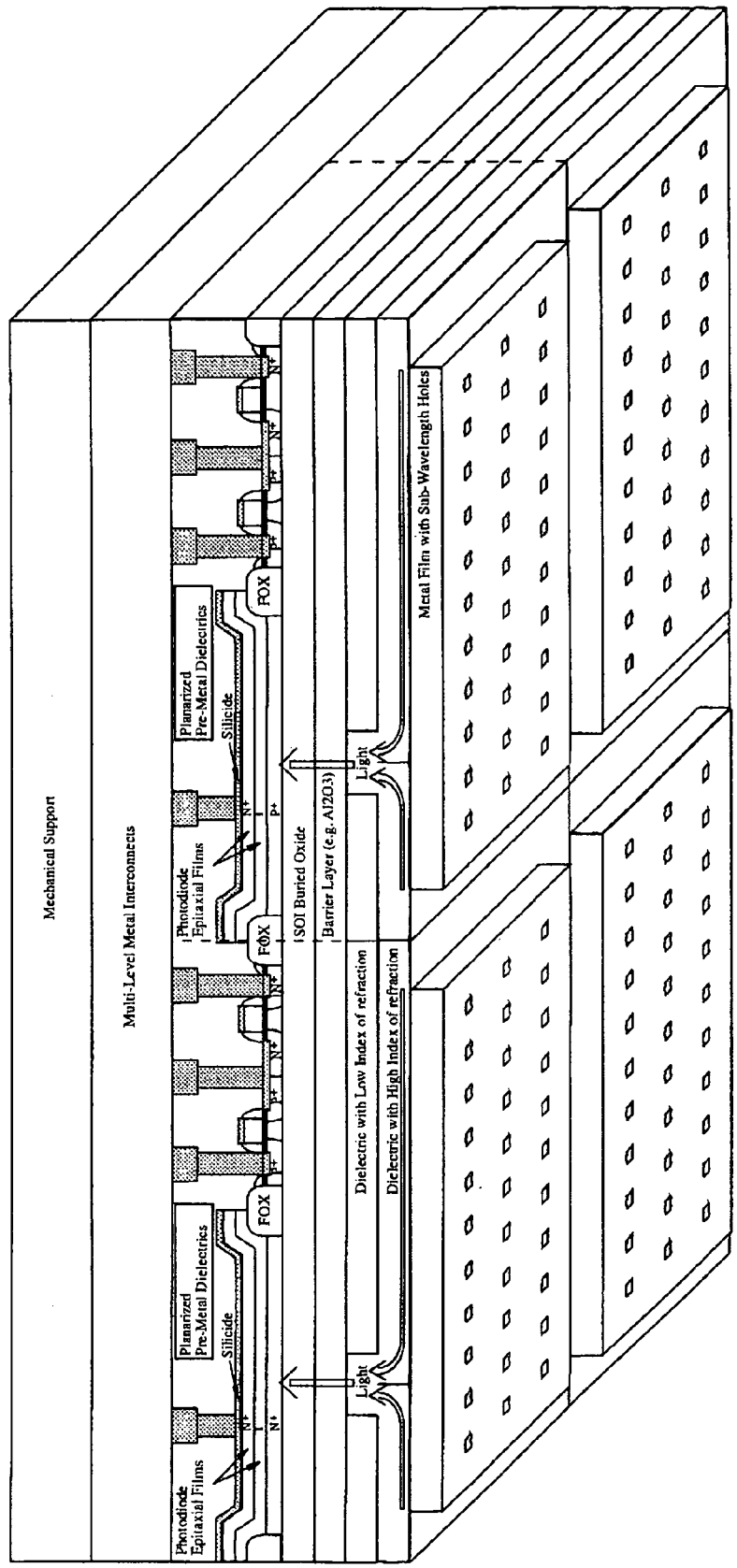
FIGS. 10A to 10E, show an exemplary Process Flow for the monolithic integration of Superlens with Back-Side Illuminated TF-SOI CMOS Image Sensors, and SPP Light-Funnels according to the First Implementation.
Figure 10B:
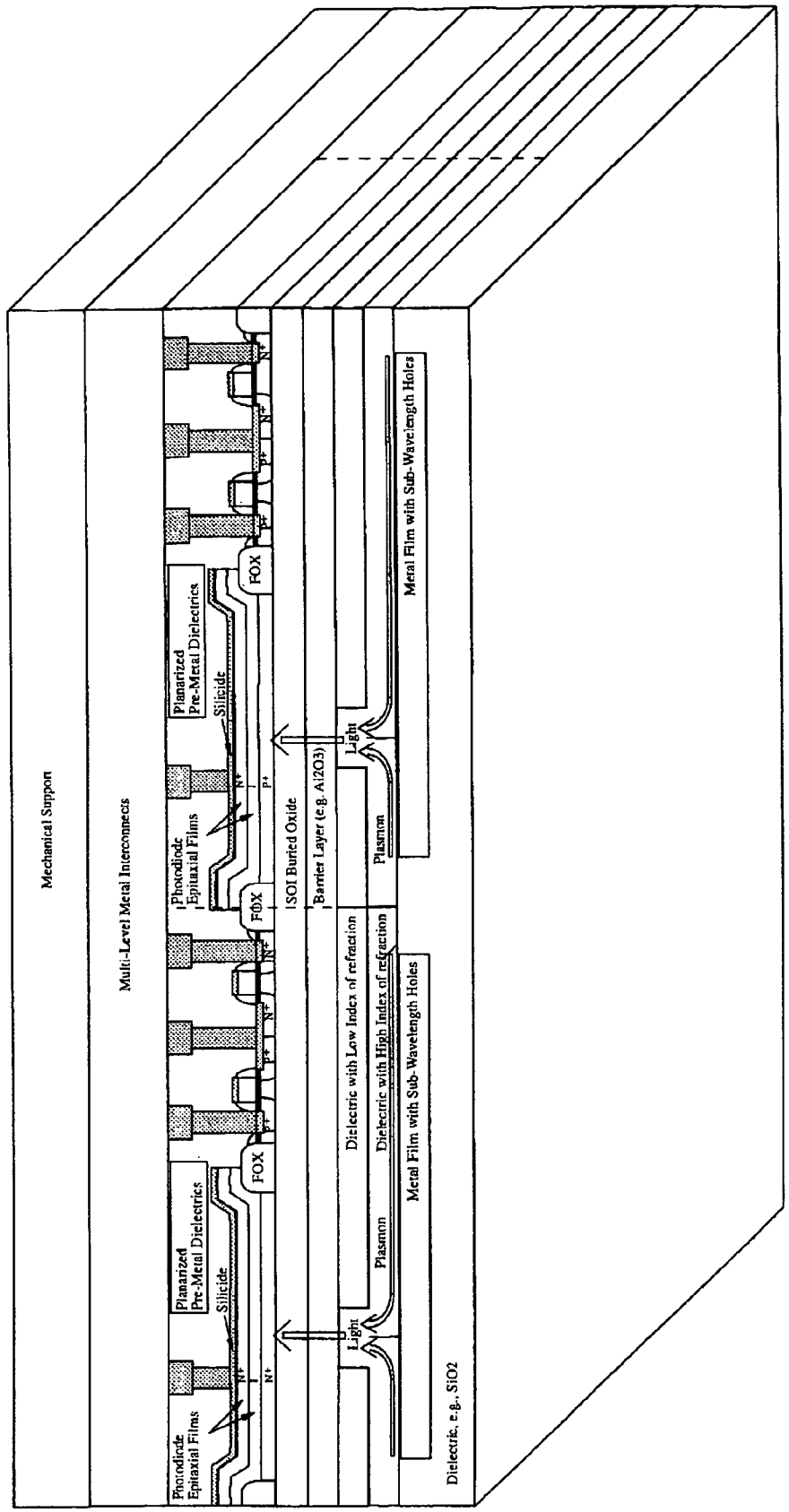

This exemplary process flow illustrates the fabrication of a "Superlens" monolithically integrated with back-side illuminated TF-SOI or TF-GeOI CMOS image sensors. Even though it is not a requirement, it will be assumed that the fabrication of the "Superlens" was preceded by the fabrication of SPP Light-Funnels according to the first implementation as described elsewhere in the present disclosure. The SPP Light-Funnels are positioned in the image plane of the "Superlens". The process flow described below starts immediately after the fabrication of the SPP Light-Funnels, prior to bonding the wafer to a transparent substrate (FIG. 10A):
1. Deposition of dielectric film, such as SiO2 for example. The thickness of this film corresponds to the ideal distance between the image plane, in which the SPP Light-Funnel elements are placed, and the rear surface of the lens, through which light exits the lens (FIG. 10B).

Fabrication of Superlens

As already mentioned, the "superlens effect" can be obtained through different concepts. Below two of those concepts are offered as alternatives.

Figure 10C:
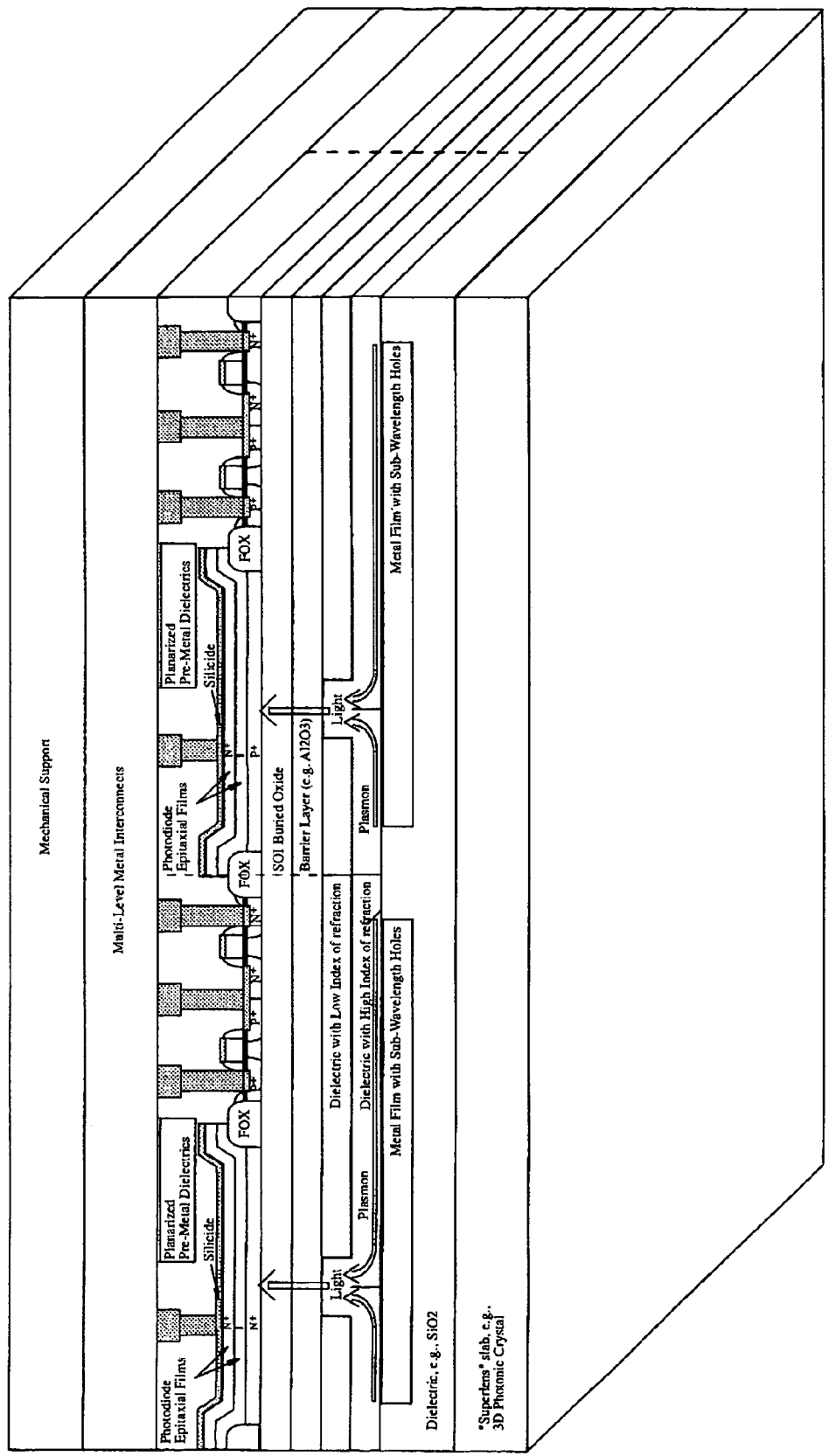

Option 2A—Metallodielectric Photonic Crystal
The fabrication of 2D photonic crystals can be easily done in a "layer-by-layer" fashion. The fabrication of 3D photonic crystal can be accomplished through different fabrication structures, techniques, and flows. For example the "woodpile" structure lends itself to be built in a "layer-by-layer" fashion. A "layer-by-layer" fashion is the preferred method for processing steps used in conventional silicon microelectronics. In the Figures, the internal details of the photonic crystal will not be shown (FIG. 10C);

Option 2B—Optical Phase Conjugation

The fabrication of an Optical Phase Conjugation medium, amounts to the fabrication of a non-linear optical medium, in the form of a thin sheet, which can be an active device performing three-wave mixing. Three-wave mixing can be achieved with non-crystalline materials, such as "chiral liquids", which are self-healing, and lend themselves to "wet" synthetic methods. This option is not shown in the Figures.

Figure 10D:
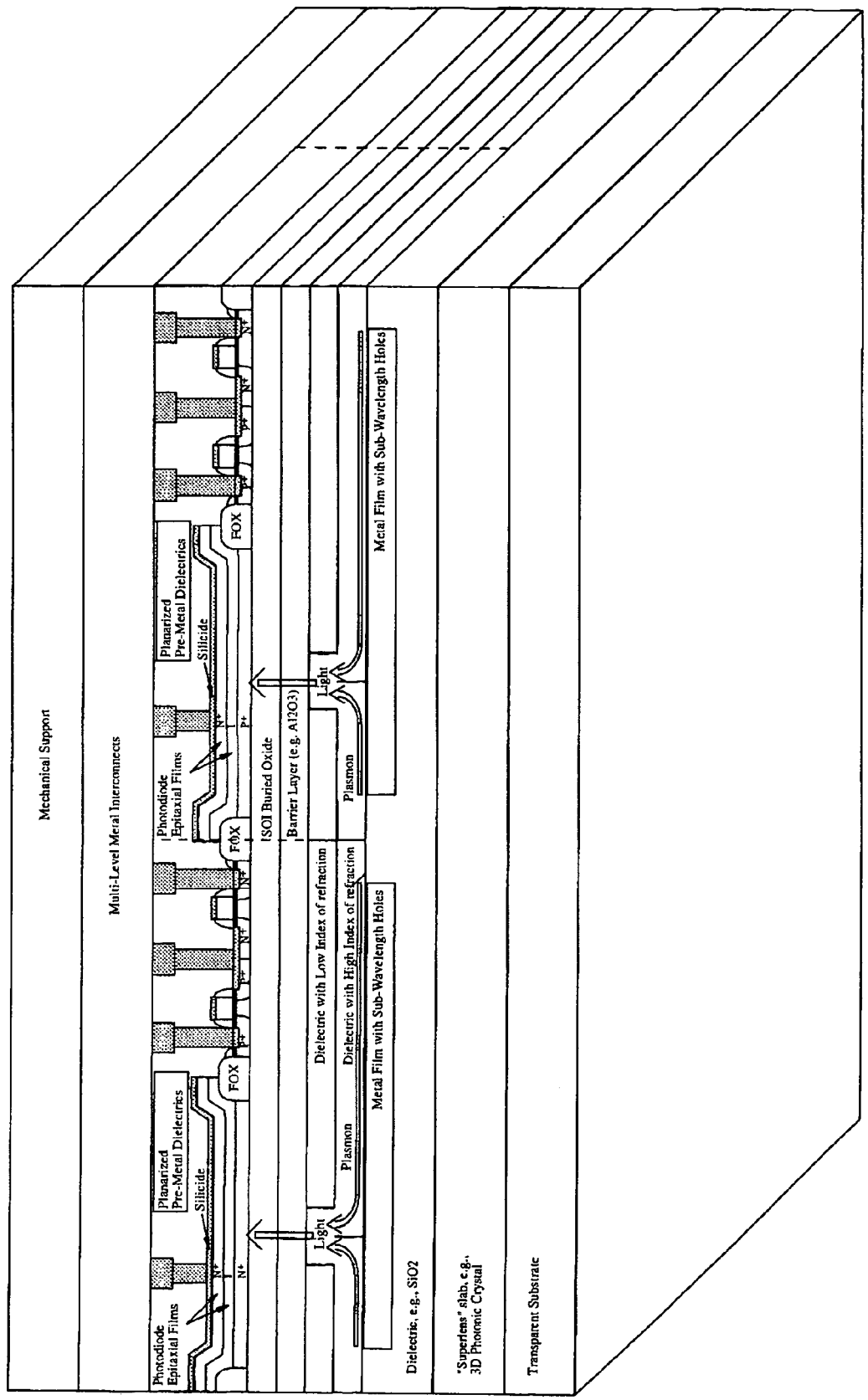

3. Wafer bonding to a transparent substrate, thereby providing a mechanical support and a protecting layer to the "superlens". The bonding processes must be performed at a temperature low enough to prevent damage to any of the structures and materials fabricated on both sides of the TF-SOI or TF-GeOI substrates (FIG. 10D).

Figure 10E:
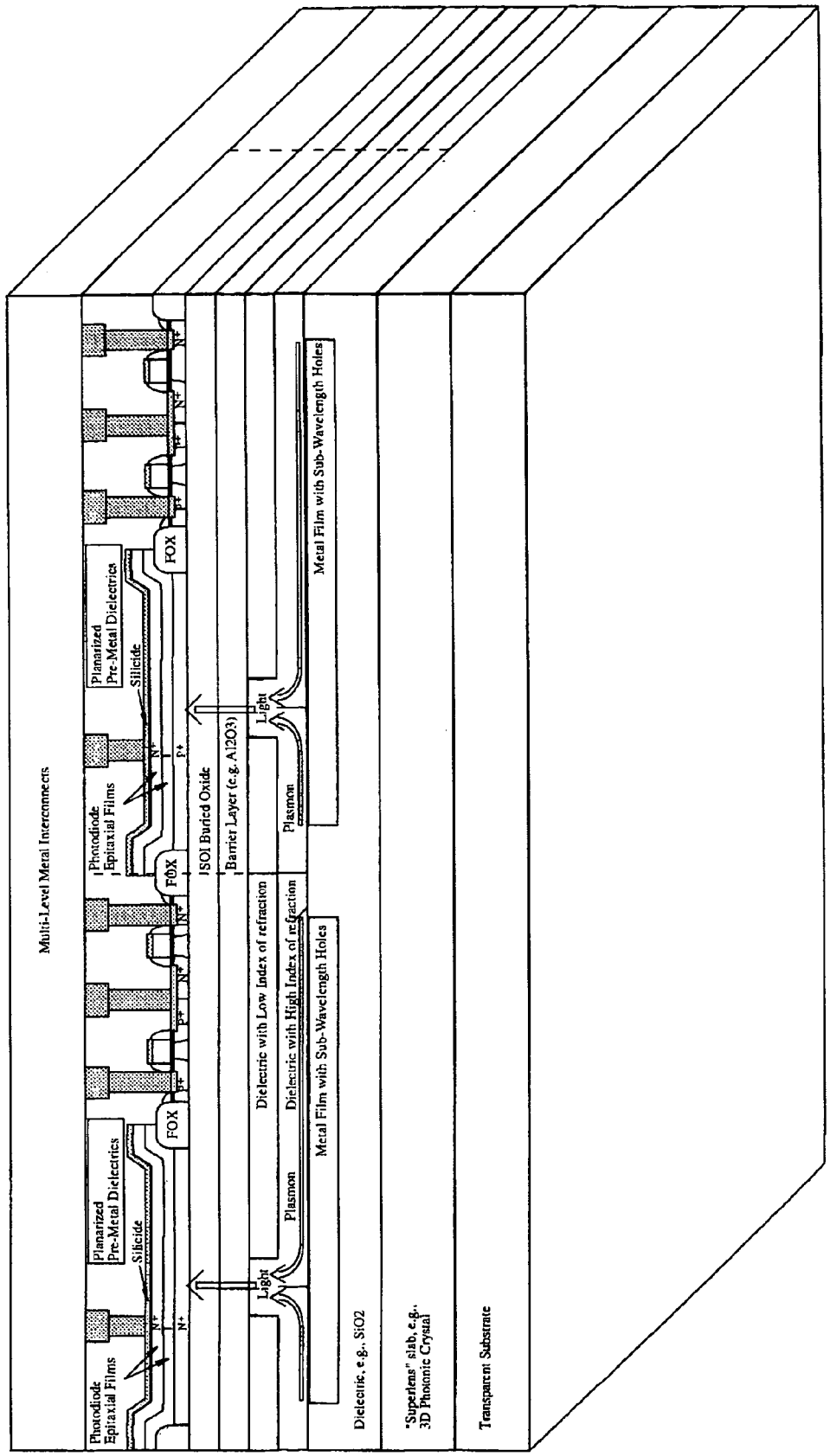

4. Removal of the mechanical holder from the front-side of the substrate (FIG. 10E).

5. Dicing and packaging of the individual "chips".

The invention claimed is:

1. A method of constructing process architecture to fabricate back-side illuminated image sensor matrices, the process architecture comprising fully-depleted CMOS devices, and photo-diodes incorporating epitaxially grown regions, the method comprising:
   (a) selecting a Thin-Film Silicon-On-Insulator (TF-SOI) or Thin-Film Germanium-On-Insulator (TF-GeOI or TF-GOI) substrate, comprising a top thin semiconductor film, a buried insulator comprising a back surface that faces a bottom thick semiconductor substrate;
   (b) fabricating the fully-depleted CMOS devices and circuitry incorporating the fully-depleted CMOS devices on the top thin semiconductor film;
   (c) Epitaxially growing photo-diode active layers on the top thin semiconductor film;
   (d) fabricating dense metal interconnects over each of the image sensor matrices, including over the photo-diode regions, on a top of the thin semiconductor film;
   (e) removing the bottom thick semiconductor substrate, after full processing of a front-side of the top thin semiconductor film;
   (f) fabricating monolithically integrated structures on the back surface of the buried insulator, aligned to the dense metal interconnects made on the top thin semiconductor film;
   (g) bonding to a new mechanical substrate that is transparent to wavelengths of interest, of the back surface of the buried insulator after fabricating the monolithically integrated structures; and
   (h) dicing and packaging each of the fully-depleted CMOS devices, or wafer-level packaging followed by separation of individual CMOS image sensor matrix chips.

2. The method of claim 1, additionally comprising embedding, with the monolithically integrated structures fabricated on the back surface of the buried insulator, at least one conventional color filter between the buried insulator and the transparent new mechanical substrate.

3. The method of claim 1, including making in-pixel homojunction or heterojunction epitaxial capacitors directly on the epitaxially grown photo-diode active layers.

4. The method of claim 1, including making in-pixel MOS capacitors directly on the epitaxially grown photo-diode active layers.

5. The method of claim 1, including making in-pixel MIM capacitors over an area of a pixel, during the fabrication of dense metal interconnects.

6. The method of claim 1, wherein the monolithically integrated structures are monolithically integrated Surface Plasmon Polariton (SPP) "Light Funnel" structures.

7. The method of claim 6, wherein the Surface Plasmon Polariton (SPP) "Light Funnel" structures are arranged into 1D or 2D arrays, on the back surface of the buried insulator, the method comprising:
   forming a thin-film on the back surface of the buried insulator, of a first insulating material that is transparent to the wavelengths of interest, as a barrier to protect said buried insulator from possible physio-chemical damage during subsequent processing;
   forming a thin-film of a second insulating material, having a low index of refraction for the wavelengths of interest;
   forming holes across the entire thickness of the second insulating material film;
   filling the holes with the first insulating material;
   forming a thin-film of a third insulating material, having a high index of refraction for the wavelengths of interest, thereby filling the holes and forming a T-shaped cross-section;
   positioning a bottom of the holes filled with the third insulating material as closely as possible to the absorption region of a photo-sensor, leading to selecting reduced thickness values for the buried insulator of a TF-SOI wafer and for the first insulating material barrier film;
   forming a thin-film of conducting material over the film of the second insulating material;
   patterning the thin film of the conducting material over the third insulating material into an array of isolated pixels of regular shapes that may be replicated to completely fill a surface, and positioning the array of isolated pixels at an image plane of a lens;
   covering an exposed surface of the isolated pixels with predetermined insulator materials having predetermined dielectric constants to tune a wavelength of operation;
   exciting resonant surface plasmon polaritons by electromagnetic radiation impinging on a top surface of the isolated pixels; and
   propagating an excitation to the bottom of the holes, where the electromagnetic radiation is coupled to, and absorbed by, a photo-sensor.

8. The method of claim 7, wherein a diameter of the holes where light is leaked out to the photo-sensors, is much smaller than the wavelength of light, without an occurrence of diffraction, and a diameter of the photo-sensors, fabricated on the top semiconductor film, is identical to a diameter of said holes plus an additional margin to accommodate a possible misalignment between said holes and said photo-sensors, resulting from separate patterning steps for respective fabrication.

9. The method of claim 8, additionally comprising perforating the thin-film of conducting material with slits and holes of desirable shapes, size and pitch in order to enhance wavelength selectivity and polarization selectivity.

10. The method of claim 7, additionally comprising perforating the thin-film of conducting material with slits and/or holes of desirable shapes, size and pitch in order to enhance wavelength selectivity and/or polarization selectivity.

11. The method of claim 6, wherein the Surface Plasmon Polariton (SPP) "Light Funnel" structures are arranged into 1D or 2D arrays, the method additionally comprising:
   centrally positioning at least one aperture in a conductor film
   surrounding the at least one aperture with symmetrically arranged corrugations on front and back surfaces of the conductor film; the top view of the pixels comprising a regular shape that can be replicated to completely fill a surface;
   interfacing the bottom and top surfaces of the conductor film with insulating materials having significantly different dielectric constants;
   positioning the top surface of the conductor film at an image plane of a lens, while the light beam exiting the bottom surface has sub-wavelength cross-section, and very low divergence;
   aligning, with high precision, a center of the aperture in each isolated conductor film, to a center of a photo-sensor inside each of the pixels.

12. The method of claim 11, wherein a diameter of the apertures where light is leaked out to the photo-sensors, is much smaller than the wavelength of light, without an occurrence of diffraction, and the diameter of the photo-sensors, fabricated on the top semiconductor film, is identical to the diameter of said apertures plus an additional margin to accommodate a possible misalignment between said apertures and said photo-sensors, resulting from the separate patterning steps for their respective fabrication.

13. The method of claim 12, additionally comprising perforating the conductor film with slits and holes of desirable shapes, size and pitch in order to enhance wavelength selectivity and polarization selectivity.

14. The method of claim 11, additionally comprising perforating the conductor film with slits and/or holes of desirable shapes, size and pitch in order to enhance wavelength selectivity and/or polarization selectivity.

15. The method of claim 11, additionally comprising fabricating the 1D or 2D arrays of the Surface Plasmon Polariton (SPP) "Light Funnel" structures on the buried oxide of back-side illuminated TF-SOI or TF-GeOI substrates, with high precision alignment to the devices fabricated on the front-side of the substrates, in particular to the photo-diodes.

16. The method of claim 11, additionally comprising fabricating the 1D or 2D arrays on top of a dielectric layer formed on a last metal layer of a complete metal stack providing interconnects on the front-side of the substrate, suitable for front-side illumination, regardless of substrate type.

17. The method of claim 11 wherein the aperture is a hole.

18. The method of claim 11 wherein the aperture is a slit.

19. The method of claim 1, wherein a back-side structure comprises a monolithically integrated "Perfect Lens" or "Superlens" planar structure, comprising layers with positive and negative indexes of refraction for the wavelengths of interest, producing image planes aligned with the 1D or 2D arrays of photo-sensors.

20. The method of any of claims 1–3, 4–19, 9–18 wherein the process architecture comprises CMOS image sensors.

* * * * *